United States Patent [19]

Hamamura et al.

[11] Patent Number: 5,447,614
[45] Date of Patent: Sep. 5, 1995

[54] METHOD OF PROCESSING A SAMPLE USING A CHARGED BEAM AND REACTIVE GASES AND SYSTEM EMPLOYING THE SAME

[75] Inventors: Yuuichi Hamamura, Yokohama; Satoshi Haraichi, Tsukuba; Akira Shimase; Junzou Azuma, both of Yokohama; Fumikazu Itoh, Fujisawa; Toshio Yamada, Hamura; Yasuhiro Koizumi, Sayama; Michinobu Mizumura, Yokohama, all of Japan

[73] Assignee: Hitachi, Ltd., Tokyo, Japan

[21] Appl. No.: 260,907

[22] Filed: Jun. 15, 1994

Related U.S. Application Data

[62] Division of Ser. No. 40,842, Mar. 31, 1993, Pat. No. 5,342,448.

[30] Foreign Application Priority Data

Mar. 31, 1992 [JP] Japan .................................. 4-076590

[51] Int. Cl.⁶ ....................... C23C 14/46; B23K 15/00
[52] U.S. Cl. ...................... 204/192.33; 204/192.34; 250/492.1; 216/59; 216/62; 216/66
[58] Field of Search .............. 204/192.32, 192.34, 204/192.33, 298.36; 156/646, 345, 626; 250/492.1, 492.3, 491.1

[56] References Cited

U.S. PATENT DOCUMENTS

| | | | |
|---|---|---|---|
| 4,609,809 | 9/1986 | Yamaguchi et al. | 204/192.34 |
| 4,874,947 | 10/1989 | Ward et al. | 156/626 |
| 4,936,968 | 6/1990 | Ohnishi et al. | 204/192.34 |
| 4,976,843 | 12/1990 | Ward et al. | 204/192.34 |
| 5,223,109 | 6/1993 | Itoh et al. | 204/192.34 |

FOREIGN PATENT DOCUMENTS 3-245529 11/1991 Japan .
03245529 11/1991 Japan .

*Primary Examiner*—R. Bruce Breneman
*Assistant Examiner*—Rodney G. McDonald
*Attorney, Agent, or Firm*—Antonelli, Terry, Stout & Kraus

[57] ABSTRACT

A method of processing a sample using a charged beam and reactive gases and a system employing the same, the method and system being able to perform the reactive etching and the beam assisted deposition using a charged particle detector free from the degradation of the performance due to the reactive gas. The system is designed in such a way that a shutter mechanism is provided in the form of the charged particle detector, and a chamber for accommodating the charged particle detector can be evacuated. In the observation of the sample, the charged particle detector is turned on to open the shutter mechanism, and in the processing of the sample, the charged particle detector is turned off or left as it is to shut the shutter mechanism to evacuate the inside of the charged particle detector.

8 Claims, 33 Drawing Sheets

FIG. 2

|  | POSITIONING OF FIRST PROCESSING HOLE | PROCESSING OF FIRST HOLE | POSITIONING OF SECOND PROCESSING HOLE | PROCESSING OF SECOND HOLE |
|---|---|---|---|---|
| REACTIVE GAS | OFF | ON | OFF | ON |
| MCP | ON | ON | ON | ON |
| SHUTTER | OPEN | CLOSE | OPEN | CLOSE |
| EXHAUST OF MCP CHAMBER | OFF | ON | OFF | ON |
| LEADING-IN ELECTRODE | ON | ON | ON | ON |
| ELECTRON SHOWER | ON | ON | ON | ON |

Column boundaries at $t_1$, $t_2 t_1$, $t_1$.

FIG. 7

| | POSITIONING OF FIRST PROCESSING HOLE | PROCESSING OF FIRST HOLE | POSITIONING OF SECOND PROCESSING HOLE | PROCESSING OF SECOND HOLE |
|---|---|---|---|---|
| REACTIVE GAS | OFF | ON | OFF | ON |
| M C P | ON | OFF | ON | OFF |
| SHUTTER | OPEN | CLOSE | OPEN | CLOSE |
| DIFFERENTIAL EXHAUST OF MCP CHAMBER | OFF | ON | OFF | ON |
| LEADING-IN ELECTRODE | ON | ON | ON | ON |
| ELECTRON SHOWER | ON | ON | ON | ON |

Time markers: $t_1$, $t_2 t_1$, $t_1$

FIG. 8

| | POSITIONING OF FIRST PROCESSING HOLE | PROCESSING OF FIRST HOLE | POSITIONING OF SECOND PROCESSING HOLE | PROCESSING OF SECOND HOLE |
|---|---|---|---|---|
| REACTIVE GAS | OFF | ON | OFF | ON |
| M C P | ON | ON | ON | ON |
| FRONT-SIDE SHUTTER | OPEN | CLOSE | OPEN | CLOSE |
| REAR-SIDE SHUTTER | CLOSE | OPEN | CLOSE | OPEN |
| LEADING-IN ELECTRODE | ON | ON | ON | ON |
| ELECTRON SHOWER | ON | ON | ON | ON |

Time markers across top: $t_1 t_1$, $t_2 t_1 t_1$, $t_1 t_1$

FIG. 13
| | POSITIONING OF FIRST PROCESSING HOLE | PROCESSING OF FIRST HOLE | POSITIONING OF SECOND PROCESSING HOLE | PROCESSING OF SECOND HOLE |
|---|---|---|---|---|
| REACTIVE GAS | OFF | ON | OFF | ON |
| M C P | ON | OFF | ON | OFF |
| SHUTTER | OPEN | CLOSE | OPEN | CLOSE |
| EXHAUST OF MCP CHAMBER | ON | ON | ON | ON |
| LEADING-IN ELECTRODE | ON | ON | ON | ON |
| ELECTRON SHOWER | ON | ON | ON | ON |
(time markers: $t_1$, $t_2 t_1$, $t_1$)
FIG. 14a
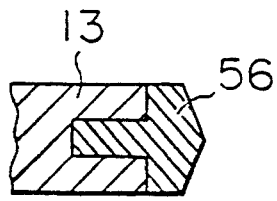
FIG. 14b
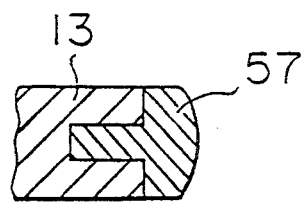

METHOD OF PROCESSING A SAMPLE USING A CHARGED BEAM AND REACTIVE GASES AND SYSTEM EMPLOYING THE SAME

This application is a divisional of prior application Ser. No. 08/040,842, filed Mar. 31, 1993 now U.S. Pat. No. 5,342,448.

BACKGROUND OF THE INVENTION

The present invention relates to a charged particle detector, or a charged beam processing of performing reactive etching, beam assisted deposition and the like using a charged beam and process gases, and more particularly to a method of processing a sample using a charged beam and reactive gases and a system employing the same.

In recent years, in a semiconductor device such as LSI, in order to promote high integration and high functionality, the wiring and the elements have been advanced in multi-layer structure. Therefore, for the purpose of performing the debugging of the LSI design and the failure analysis in the manufacturing process, the request of cutting the wiring on a chip or connecting arbitrary parts to each other to perform the circuit modification for a short time has increased rapidly. For such circuit modification, it is necessary to perform the processing over several tens of positions on one LSI, and therefore the processing must be performed at high speed and at a high yield near 100%.

Out of the above-mentioned methods, as for the method of cutting the wiring, the sputtering processing method has heretofore been employed in which the atoms contained in the wiring material are sputtered by the focused ion beam. In this method, however, there arised serious problems that the processing speed is too slow, the selectivity is small for the material of a workpiece, and the sputtered atoms are deposited to the side face of the workpiece.

On the other hand, if the chemical reactive etching is used in which the reactive gases and the charged beam such as the focused ion beam or the electron beam, the processing can be performed at high speed several tens of times as rapid as the sputtering processing, and the selectivity for a layer under the layer to be processed can be increased by selecting the kind of reactive gas. In addition, it is possible to perform the processing with accuracy by which even for the sample having remarkable irregulation, the lower layer is not damaged.

However, in the case of the chemical reactive etching method, when the reactive gases are introduced, a charged particle detector for detecting an image is exposed to the reactive gases by the diffusion of the reactive gases, so that an active surface of the charged particle detector is corroded. As a result, there arised a problem that the performance of the secondary particle detector is readily degraded, and thus the charged particle detector must be exchanged frequently.

Then, there is well known JP-A-3-245529, as the prior art, in which in order to solve the above-mentioned problem, a shutter mechanism is provided in the front of a secondary electron amplification unit of the charged particle detector.

In the above-mentioned prior art, in the case where after the desired processing has been performed using the reactive gases and before a main chamber is not sufficiently exhausted, the shutter mechanism provided in the front of the secondary electron amplification unit of the charged particle detector is opened, the remaining reactive gases enter into the charged particle detector. Then, if the shutter mechanism is shut in order to perform the processing again with the processing state left as it is, the reactive gases will be shut in the charged particle detector. Therefore, it is impossible to prevent the performance of the charged particle detector from being degraded. Moreover, by repeating the opening and shutting of the shutter mechanism, likewise, the reactive gases will remain in the charged particle detector. Therefore, the problem of the degradation of the performance can not be avoided. In addition, in the case where even if this shutter mechanism is provided, the process gases can not be necessarily, perfectly intercepted due to the limitation in construction, the process gases leak through a small gap to enter into the detector, and as a result, there is the possibility that the performance is degraded due to the corrosion.

SUMMARY OF THE INVENTION

It is therefore an object of the present invention to provide a charged particle detector which is free from the degradation of the performance due to the process gases, and to provide a charged beam processing system which is capable of performing the reactive etching and the beam assisted deposition using such a charged particular detector, and a method utilized in the same.

In order to attain the above-mentioned object, according to the present invention, the system is designed in such a way that a shutter mechanism is provided in the front of a secondary electron amplification unit, and a chamber in which a charged particle detector is accommodated can be evacuated. Then, during the observation, the charged particle detector is turned on to open the shutter mechanism, and during the processing, the charged particle detector is turned off or left as it is to shut the shutter mechanism, and the inside of the charged particle detector is evacuated.

Moreover, in the above-mentioned construction, at least one of a mechanism for spraying inactive gases on the front face of the charged particle detector and the surface of the sample, and a mechanism for absorbing the reactive gases, i.e., the process gases on a cooling unit by the cooling is used in combination therewith.

Out of the above-mentioned construction, in the system in which the shutter mechanism is provided, and the inside of the charged particle detector is evacuated, during the observation, the charged particle detector is turned on to open the shutter mechanism, and when the process gases are supplied, the charged particle detector is turned off to shut the shutter mechanism, and the inside of the charged particle detector is evacuated, whereby the process gases are prevented from entering into the detector, and even if the process gases enter thereinto, the process gases can be immediately evacuated therefrom. Therefore, it is possible to prevent the charged particle detector from being degraded. Moreover, when the process gases are supplied, the charged particle detector is turned off, whereby it is possible to prevent the gases remaining in the inside, or the gases, which have been introduced, from being adsorbed on the active surface of the secondary electron amplification unit to react on that active surface.

Moreover, out of the above-mentioned construction, in the system which employs the mechanism for spraying the inactive gases on the front face of the charged particle detector and the surface of the sample, and the mechanism for adsorbing the process gases on the cooling unit by the cooling, in addition to the shutter mechanism, it is possible to more effectively prevent the process gases from entering into the charged particle detector.

BRIEF DESCRIPTION OF THE DRAWINGS

FIG. 2 is a diagram showing the operational sequence of elements of the system of the first embodiment during the observation of a sample and during the processing thereof;

FIG. 7 is a diagram showing the operational sequence of elements of the system of the second embodiment;

FIG. 8 is a diagram showing the operational sequence of elements of the system of a third embodiment;

FIG. 13 is a diagram showing the operational sequence of elements of a system of a fifth embodiment;

FIGS. 14a and 14b are cross sectional views showing different configurations of sealants of a system of a sixth embodiment;

DESCRIPTION OF THE PREFERRED EMBODIMENTS

The preferred embodiments of the present invention will hereinafter be described in detail with reference to the accompanying drawings.

Embodiment 1

Figure 1:
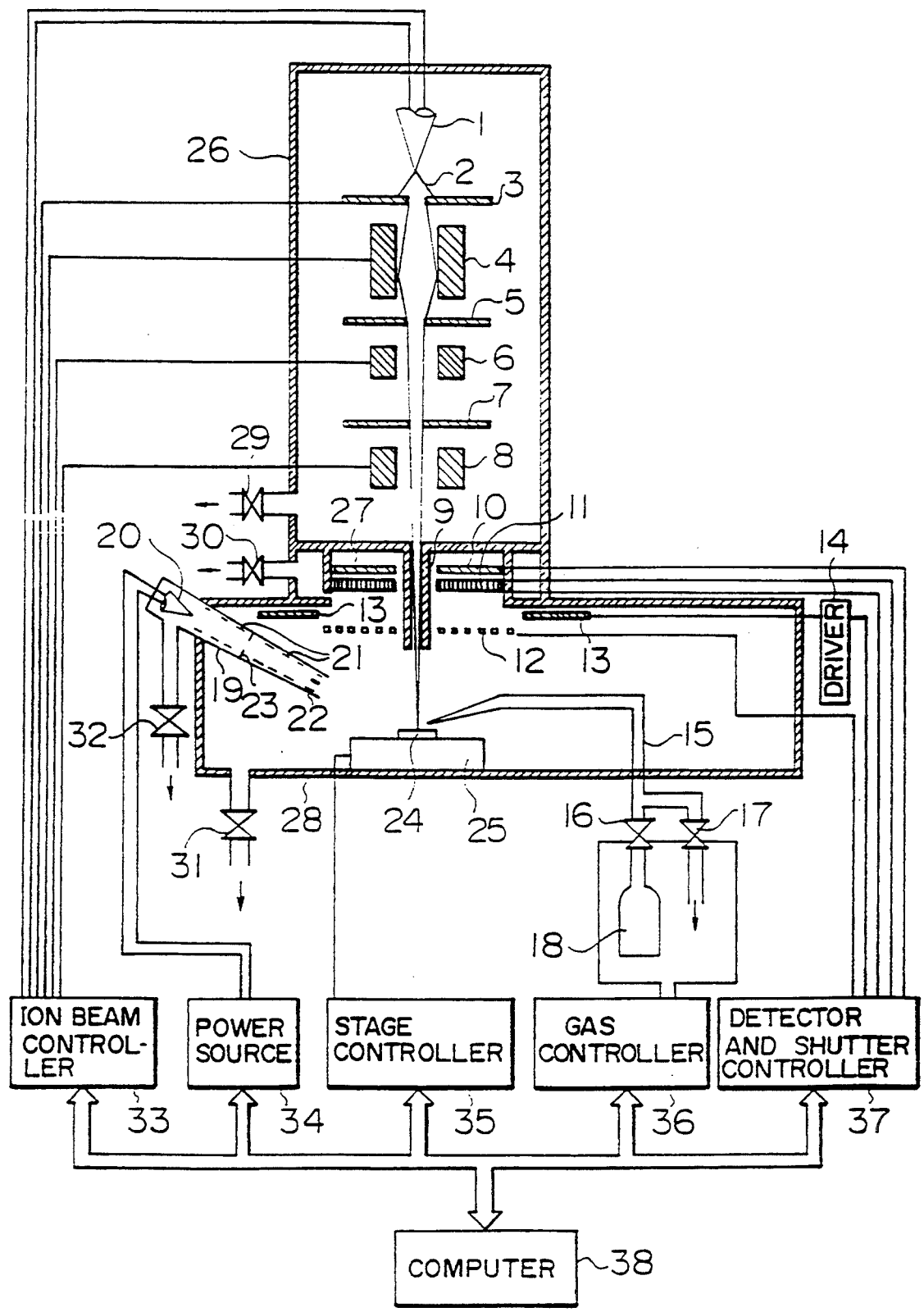
FIG. 1 is a cross sectional view, partly in block diagram, showing the construction of a system of a first embodiment according to the present invention.

FIG. 1 shows a view of the construction of a system when a detector according to the present invention is applied to a focused ion beam local etching system. In an ion beam chamber (hereinafter, referred to as "an IB chamber" for short, when applicable) 26, ion beams 2 are extracted from an ion source 1 by an extraction electrode 3 and then are focused through a before-focusing lens 4, an aperture 5 and an after-focusing lens 6. Then, the focused ion beams are emitted through an aperture 7 to be deflected by a deflector electrode 8. This ion beam optical system is controlled by an ion beam controller 33.

In a main chamber 28, a sample 24 is mounted on a stage 25, and reactive gases are sprayed on a surface of the sample 24 with a nozzle 15. This nozzle 15 is connected to a reactive gas bomb 18 through a valve 16 for adjusting a flow rate.

For a passage of the ion beams 2, an optical path pipe 9 having a sufficient small conductance is provided between the main chamber 28 and the IB chamber 26. Valves 29 and 31 are opened to evacuate the two chambers differentially using a vacuum pump (not shown). As a result, even if process gases are introduced into the main chamber 28, the inside of the IB chamber 26 can be kept at a high vacuum.

For the detection of the processing position of the sample 24, an image by a scanning ion microscope (hereinafter, referred to as "an SIM image" for short, when applicable) which detects synchronously the secondary ions generated by the radiation of the ion beams 2 is used. In the present embodiment, as a charged particle detector for detecting the secondary ions emitted from the surface of the sample, a micro channel plate (hereinafter, referred to as "MCP" for short, when applicable) 11 is employed. The secondary ions are led to MCP 11 by a leading-in electrode 12 and then the secondary electrons which have been amplified by MCP 11 are detected by a detection electrode 10. The optical path pipe 9 is grounded so as to prevent the electric fields by those electrodes from affecting the ion beams 2. In order to prevent MCP 11 from being exposed to the reactive gases, a shutter 13 which is driven by a driver 14, which is provided outside the vacuum chamber, and a rod is provided in the front of MCP 11.

Figure 12:
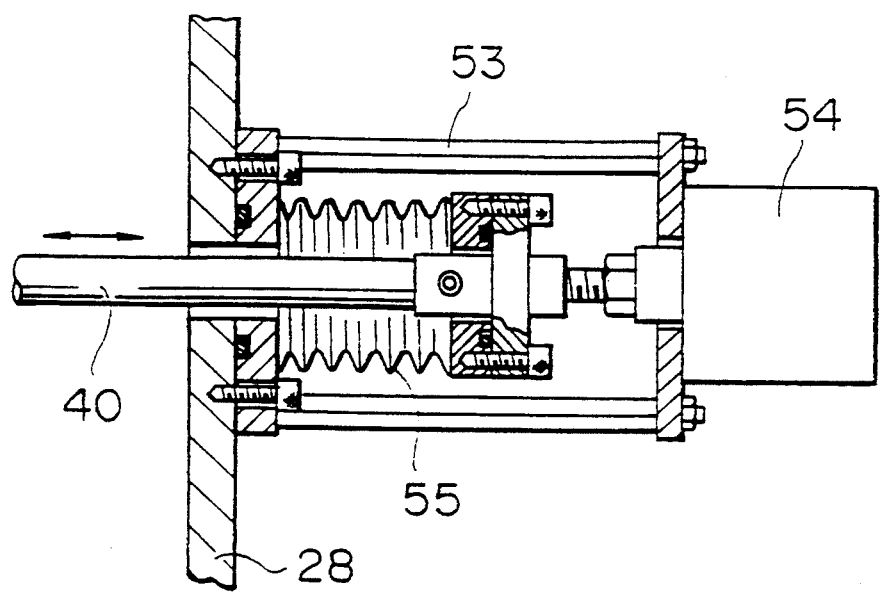
FIG. 12 is a cross sectional view showing the construction of a shutter driving unit of the system of the embodiment 1.

FIG. 12 is a cross sectional view showing schematically the construction of the driver. A push rod 40 is moved by an air cylinder 54 fixed to a housing 53. At this time, the desired degree of vacuum can be kept by the telescopic motion of a bellow 55. In order to prevent the opening and shutting of the shutter 13 from changing the electric field which is radiated toward the sample 24 by the leading-in electrode 12 to which a predetermined voltage is applied, the shutter 13 needs to be provided in a position opposite to the sample 24 with respect to the leading-in electrode 12, i.e., between the leading-in electrode 12 and MCP 11 in such a way that the ion beams 2 can pass. If this shutter 13 is shut, the inside of an MCP chamber 27 surrounding MCP 11 is shut tightly. Therefore, even when the process gases are being used in the main chamber 28, a valve 30 is opened so that the MCP chamber 27 can be kept at a high vacuum by the vacuum pump (not shown).

Moreover, an electron gun 19 is provided which is used to neutralize the positive charges of the ion beams 2 which are accumulated on the surface of the sample 24. The electrons which have been emitted from an electron source 20 incorporated in the electron gun 19 are focused by a lens 21 and then are deflected by a deflection electrode 22 to be supplied to the surface of the sample 24. The inside of the electrode gun 19 in which an orifice 23 is provided is always evacuated differentially by the vacuum pump (not shown) with a valve 32 opened. As a result, it is possible to prevent the electron source 20 from being degraded due to the exposure to the process gases. The electron beams are focused so as to have a diameter of about 0.5 mm in the position of the orifice 23 and then are passed through the orifice 23 with a bore diameter of about 1.0 mm. Then, the electron beams are focused again by the second-stage lens to obtain the electron beam which has a beam diameter of 1 mm and a beam current of about 100 nA. Moreover, by the provision of the orifice 23, when the main chamber 28 is at $1.0 \times 10^{-4}$ Torr, the ambient pressure of the electron source 20 can be kept at pressures of about $1.0 \times 10^{-6}$ Torr, and as a result the life time of the electron source 20 can be increased by about 100 times.

Now, in FIG. 1, the reference numeral 34 designates a power source for the electron gun, the reference numeral 35 designates a stage controller for controlling the movement of the stage 25, the reference numeral 36 designates a controller for controlling the gas supply/evacuate valves, and the reference numeral 37 designates a controller for controlling the secondary ions detector, and the opening and shutting of the shutter. In this connection, the controller group including the above-mentioned ion beam controller 33 is controlled by a computer 38.

Next, the description will hereinbelow be given with respect to an example of the control process and the operation of the elements of the system when the system of the present embodiment is applied with reference to FIG. 2, FIGS. 3a and 3b, and FIGS. 4a and 4b.

Figure 3A:
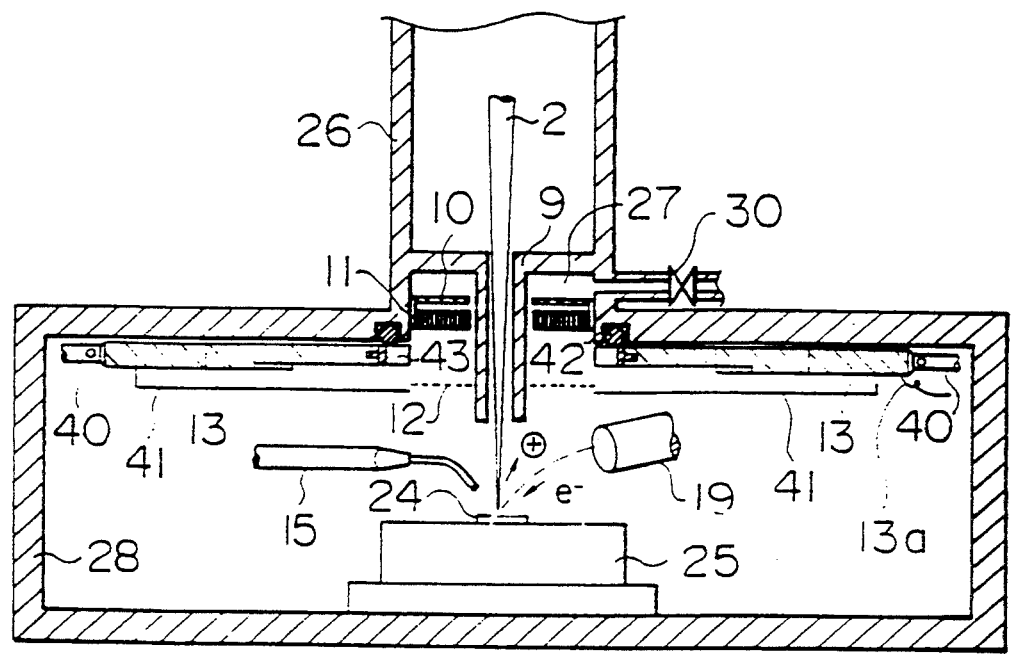
FIGS. 3a and 3b are respectively a cross sectional view and a plane view of the system of the first embodiment each showing a state during the observation of the sample.
Figure 3B:
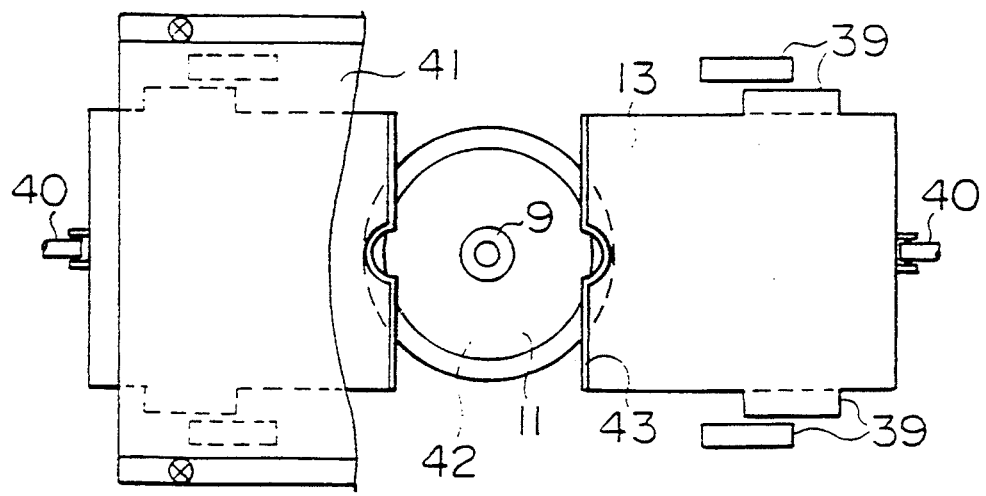
Figure 4A:
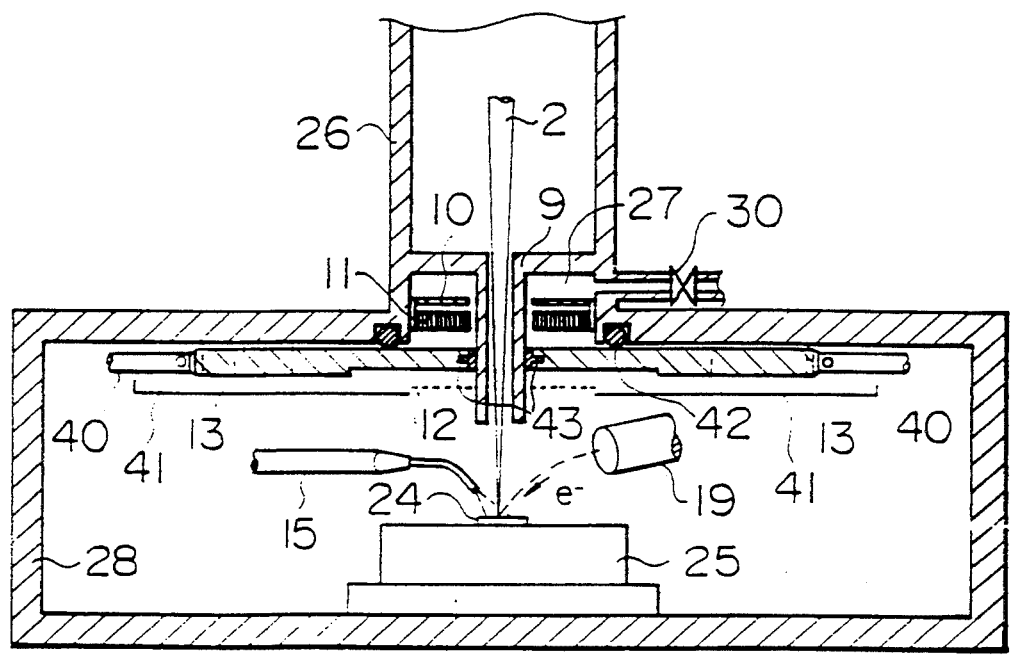
FIGS. 4a and 4b are respectively a cross sectional view and a plane view of the system of the first embodiment each showing a state during the processing of the sample.
Figure 4B:
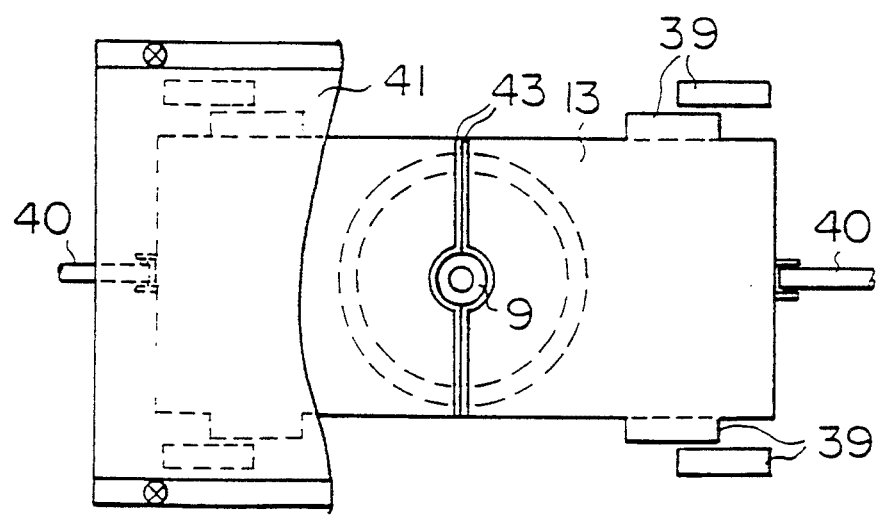

FIG. 2 is a diagram showing the operational sequence of the states of the elements during the observation of the sample and during the processing thereof. FIG. 3a is a cross sectional view showing schematically the states of the elements of the system during the observation of the sample. FIG. 4a is a cross sectional view showing schematically the states of the elements of the system during the processing of the sample. FIGS. 3b and 4b are plane views of the system when viewing the states of the elements from the lower side.

First, the stage 25 is moved by the stage controller 35 while observing the SIM image of the sample 24 to perform the setting of the processing positions and the processing areas of the sample 24. At this time, in MCP 11, the voltages V1 and V2 are applied to the front stage and the rear stage, respectively. The voltage V0 is applied to the leading-in electrode 12. Thus, the secondary ions emitted from the surface of the sample 24 are accelerated by the leading-in electrode 12, and are amplified by MCP 11 and finally are detected by the detection electrode 10. One shutter 13 is provided on either side. Then, the two shutters 13 are housed in the both ends to provide a state of "opening" so as to allow the secondary ions to pass. Although the electron shower is used to prevent the charge up of the sample 24 due to the application of the ion beams during the processing, it is always supplied to prevent the setting of the processing positions and the processing areas from being changed due to the change of the electric field for a period of time ranging from the observation to the processing. The valve 16 is closed, the valve 17 is opened, and the reactive gases in the nozzle 15 are evacuated by the vacuum pump (not shown). Then, the valve 30 is closed and the MCP chamber 27 is not exhausted. The optical path pipe 9 is always grounded so as to prevent the ion beams 2 from being influenced due to the electric fields generated by the application of the voltages to MCP 11 and the leading-in electrode 12, as was described above. Moreover, a shielding cover 41 is also always grounded which is used to prevent the distribution of the electric potential from being changed due to the opening and shutting of the shutters 13.

After setting the processing positions and the processing areas in such a manner, each shutter 13 is moved toward the axis of the optical path pipe 9 to provide a state of "shutting". After a lapse of the period of time t1 required for each shutter 13 to be perfectly shut, the valve 16 is opened, and the valve 17 is closed so that the reactive gases are supplied from the nozzle 15 to the surface of the sample 24. In FIGS. 3a and 3b, the system is designed in such a way that the reactive gases which are introduced to intend to enter from the upper surfaces of the shutters 13 into the MCP chamber 27 are intercepted by an O ring 42, and the inflow of the reactive gas from an interval between the two shutters 13, i.e., both the lower surface and the side face of each shutter 13 thereinto is intercepted by a seal 43. Therefore, it is possible to prevent the degradation of MCP 11. In addition, since when the shutters 13 are shut, the inside of the MCP chamber 27 is shut tightly, in order to remove a small amount of remaining and leaking gas, the valve 30 is opened to evacuate the MCP chamber 27. Thus, in the case where the reactive gases are perfectly intercepted, there is no necessity of setting the applied voltage to MCP 11 to zero. However, in the case of the imperfect interception, the applied voltage to MCP 11 needs to be set to zero. The interception performance for the reactive gas depends on the pressing forces of the O ring 42 and the sealant 43 when shutting the shutters 13. The pressing force of the O ring 42 depends on the vertical position of the shutters 13. The pressing force of the sealant 43 can be adjusted by selecting the air pressure of the air cylinder 54.

Moreover, the voltage applied to the leading-in electrode 12 is also, after shutting the shutters 13, applied thereto so as to prevent the setting of the processing positions and the processing areas, which were done previously, from being changed due to the change of the distribution of the electric potential over the sample 24. The shielding cover 41 is always grounded. Further it is also effective to apply a suitable voltage to each shutter 13 through a conductor 13a in order to make the electric field near the sample identical to that when the shutter 13 is in the state of "opening". But, in this case, an insulating member needs to be held between supporting parts such as a cross roller guide 39 of the shutter 13 to insulate the shutter 13 from the main chamber 28. Incidentally, in general, since $-600$ V and $-100$ V are applied to MCP 11 and the leading-in electrode 12, respectively, for example, it is effective to apply $-200$ V to the shutter 13.

For the sample 24, the reactive etching is performed using the reactive gases which are activated by the ion beams 2. Then, after the sample 24 has been processed to the desired depth on the basis of the processing speed which was previously obtained based on the experiments, the valve 16 is closed and the valve 17 is opened so that the remaining reactive gases are evacuated until the pressure in the main chamber 28 decreases to a value (about $5.0 \times 10^{-6}$ Torr) less than or equal to the allowable operating degree of vacuum of MCP 11 (the required evacuation period of time is t2). Thereafter, the shutter 13 is opened, and at the same time the evacuation of the MCP chamber 27 is stopped so that the subsequent processing position is observed to perform the positioning. Thereafter, this operation will be repeatedly performed. Then, the series of operation can be performed on the basis of the control by the computer 38.

In the above-mentioned control process, the processing position and the processing area are determined for the processing for one position, and such a processing is repeatedly performed. However, in the case where a plurality of processing positions are close to one another, the SIM images of the processing positions and the processing areas are registrated in an image memory by the observation of one time. Then, on the basis of the information stored in the memory, the processings of the plurality of positions can be performed.

According to the present embodiment, it is possible to prevent the degradation of MCP 11 due to the reactive gas, and thus the stable operation of the system can be performed.

Embodiment 2

Next, an embodiment 2 of the present invention will hereinbelow be described in detail with reference to FIG. 5, FIGS. 6a and 6b, and FIG. 7.

Figure 5:
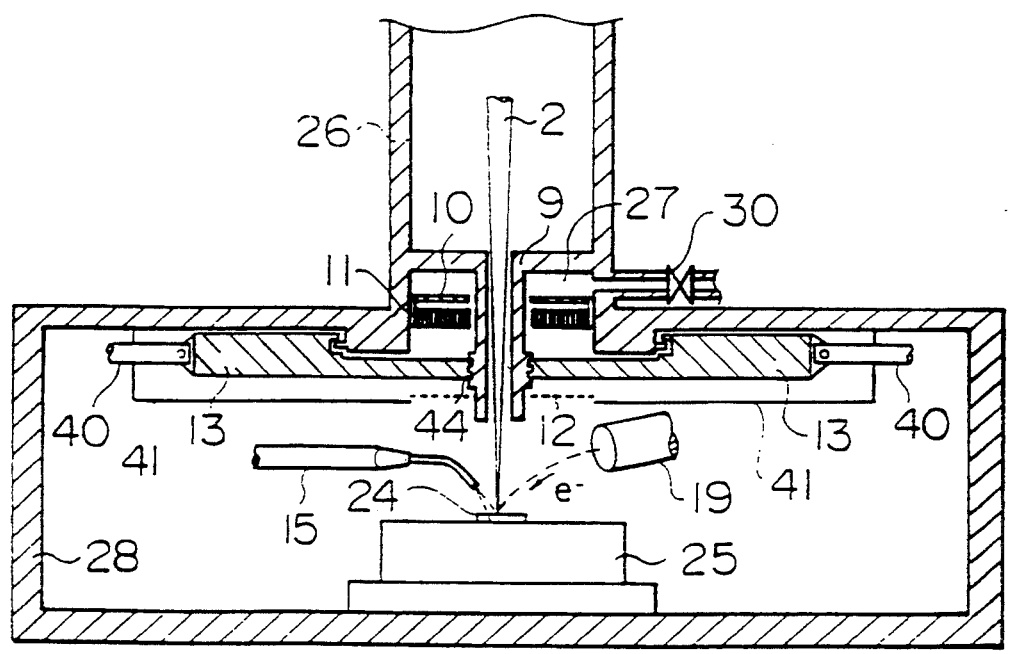
FIG. 5 is a cross sectional view of a system of a second embodiment showing a state during the processing of the sample.
Figure 6A:
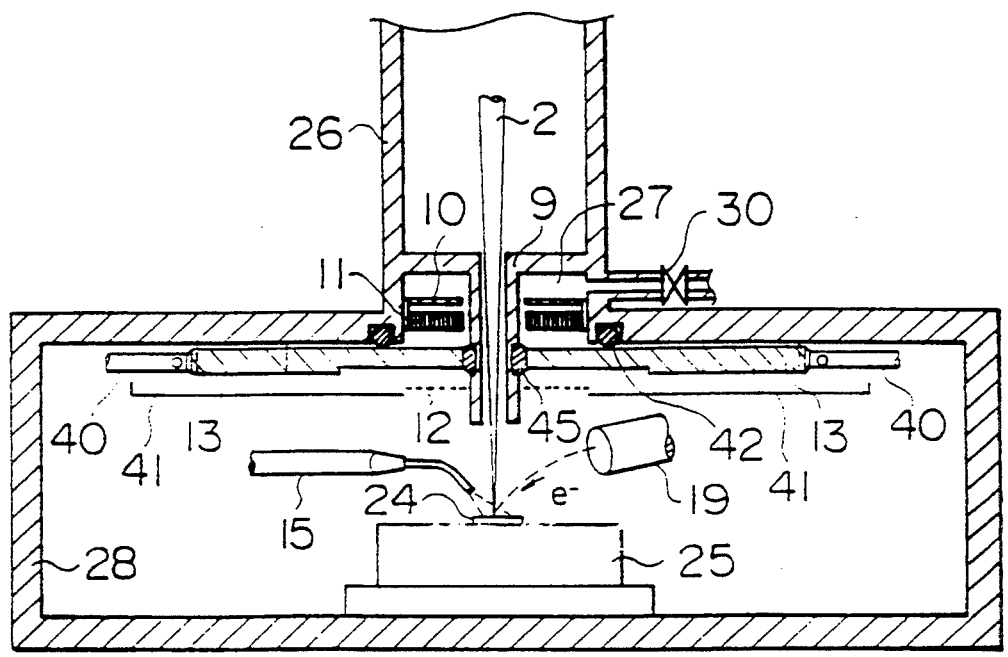
FIGS. 6a and 6b are respectively a cross sectional view and a plane view of the system of the second embodiment each showing a state during the processing of the sample.
Figure 6B:
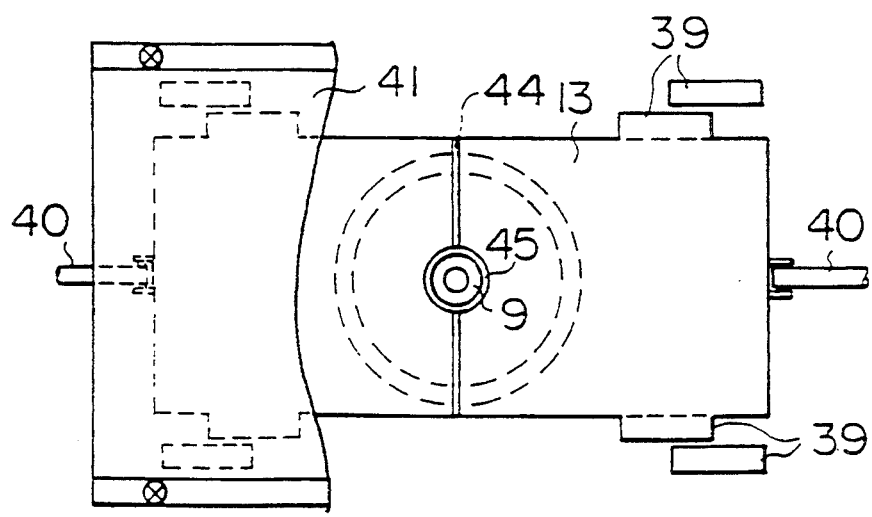

In the above-mentioned embodiment 1, the sealant having a complicated configuration needs to be used in which a half moon-like part as in the seal 43 is provided. However, in the present embodiment, such a member is not employed. Referring first to FIG. 5, there is shown a system in which even when shutting the shutters 13, the reactive gases are not perfectly intercepted and the MCP chamber 27 is differentially evacuated, thereby to prevent the degradation of MCP 11. In the present embodiment, from the point of view wherein the inflow of the reactive gases needs to hardly occur and the conductance for perforating the differential evacuation needs to be made sufficiently small, the construction of a labyrinth packing 44 is adopted. FIG. 7 is a diagram showing the control process of this system. A point of difference of the present embodiment from the embodiment 1 is that although the suitable voltage is applied to MCP 11 when performing the positioning for the processing, during the processing, only a small amount of reactive gas enter into the MCP chamber 27, and therefore, for the purpose of preventing the degradation of MCP 11, no voltage is applied to MCP 11. Moreover, FIGS. 6a and 6b show a system in which the O ring as the standardized goods and the labyrinth packing construction are combined with each other. The inflow of the reactive gas from the upper side of the shutters 13 into the MCP chamber 27 is intercepted by the O ring 42, the inflow of the gas from the lower side of the shutters 13 thereinto through the periphery of the optical path pipe 9 is intercepted by the O ring 45, and the inflow of the gas from the interval between the two shutters 13 is intercepted by the construction of the labyrinth packing 44 (refer to FIG. 6b). The control process is the same as that of FIG. 7. The present embodiment is effective in the case where the reactivity of the process gas is small, or in the case where the supply amount of process gas is small because of the simple construction.

Embodiment 3

Figure 9:
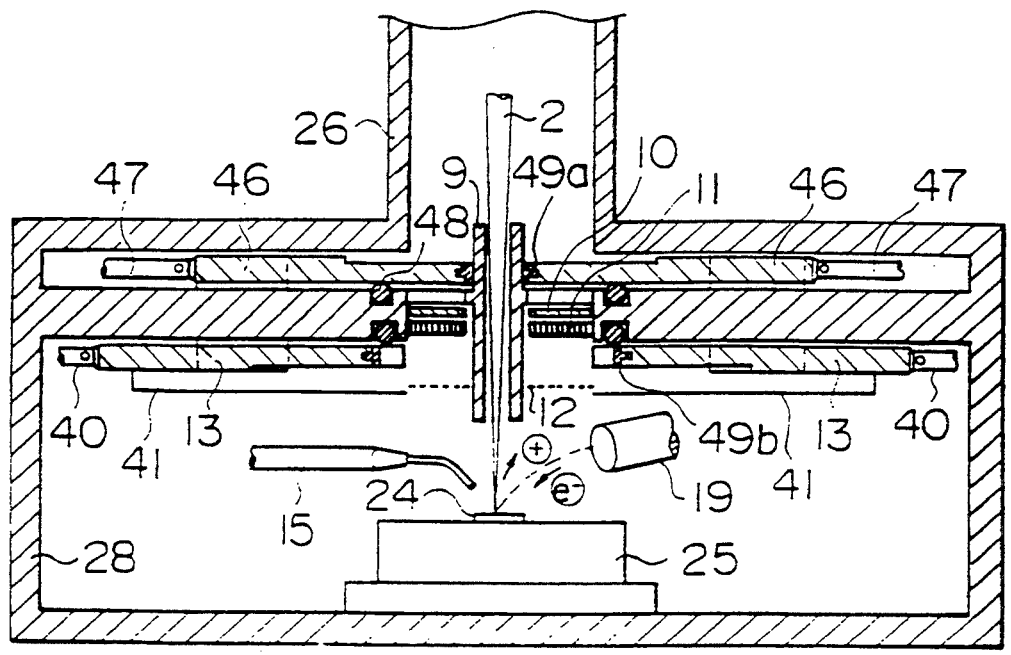
FIG. 9 is a cross sectional view of the system of the third embodiment showing a state during the observation of the sample.
Figure 10:
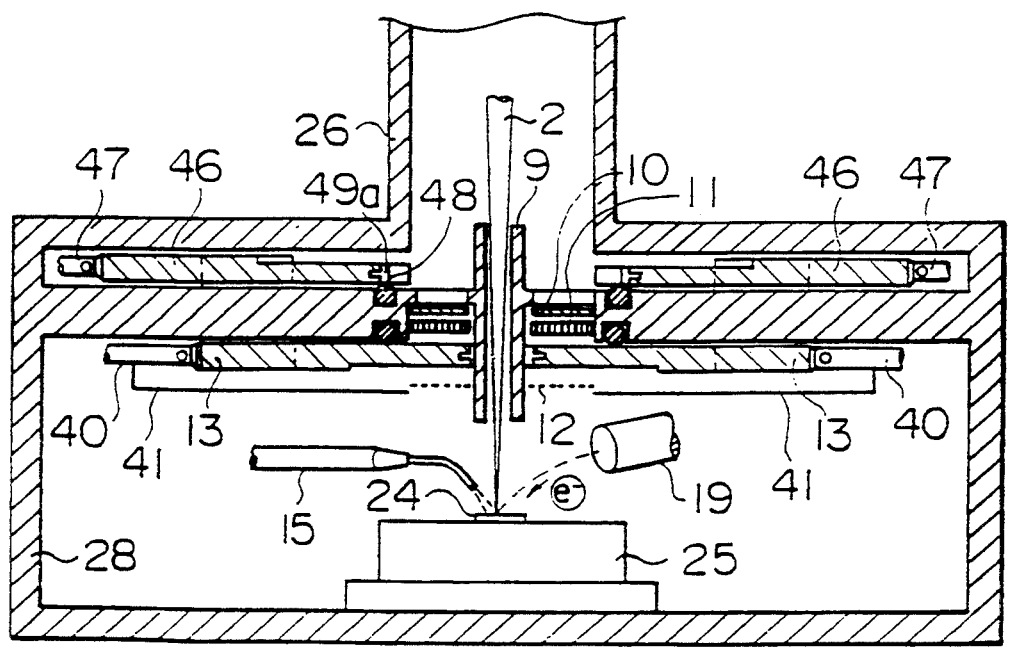
FIG. 10 is a cross sectional view of the system of the third embodiment showing a state during the processing of the sample.

Next, an embodiment 3 of the present invention will hereinbelow be described in detail with reference to FIGS. 8, 9 and 10. FIG. 8 shows the sequence of the states of the elements of the system during the observation and during the processing. FIG. 9 is a schematic view showing the states of the elements of the system during the observation of the sample. FIG. 10 is a schematic view showing the states of the elements of the system during the processing of the sample. In the present embodiment, as shown in FIG. 9, one pair of shutters 46 are further provided in the IB chamber 26 of the system of the embodiment 1, and thus no MCP chamber 27 is provided. Each pair of shutters are designed in such a way that a hole for allowing the ion beams 2 to pass therethrough is formed, and an interval between the periphery of the optical path pipe 9 and the pair of shutters 46 is sealed tightly by sealants (48, 49). The control process of the present system is shown in FIG. 8. First, in the first positioning for the processing, the front-side shutters 13 are opened, and the rear-side shutters 46 are shut. After the completion of the positioning, the front-side shutters 13 begin to be shut. After the lapse of the period of time t1 required for the front-side shutters 13 to be completely shut, the rear-side shutters 46 are opened. This reason for taking such operation is that if the two pairs of shutters are simultaneously opened, when the conductance of the passage between the IB chamber 26 and the main chamber 28 is large, the backflow occurs in the weaker exhaust system and as a result the differential evacuation can not be performed. After the lapse of the period of time t1 ranging from the time when the rear-side shutters 46 begin to be opened to the time when they are completely opened, the processing for the first hole to be obtained is started. After the completion of the processing for the hole, the reactive gases near the sample 24 are evacuated for the period of time t2 until the degree of vacuum increases to a value more than or equal to the allowable degree of vacuum. Thereafter, the rear-side shutters 46 are shut, and after the completion of the shutting, the front-side shutters 13 are opened to perform the positioning for the second hole to be obtained.

Moreover, the present embodiment is designed in such a way that no MCP chamber 27 is provided. However, the MCP chamber 27 may also be provided as in the above-mentioned embodiment 1. In this case, the MCP chamber 27 is evacuated during the observation as well as during the processing.

Embodiment 4

Figure 11A:
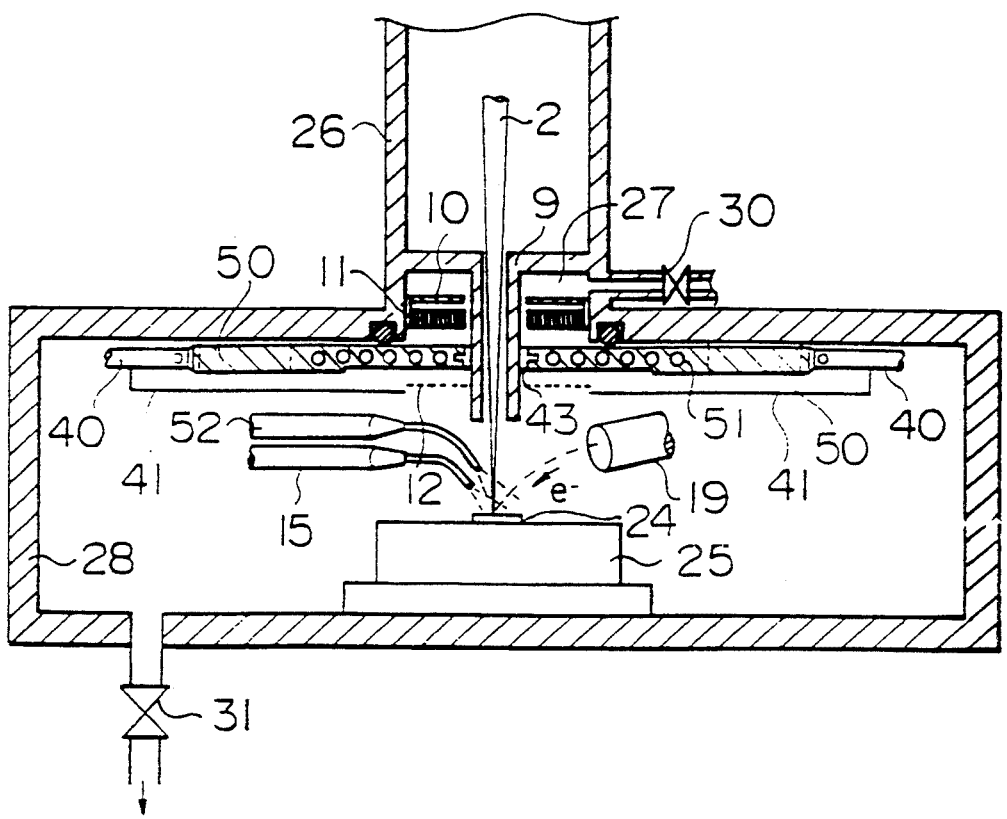
FIGS. 11a and 11b are respectively a cross sectional view and a plane view of a system of a fourth embodiment each showing a state during the processing of the sample.
Figure 11B:
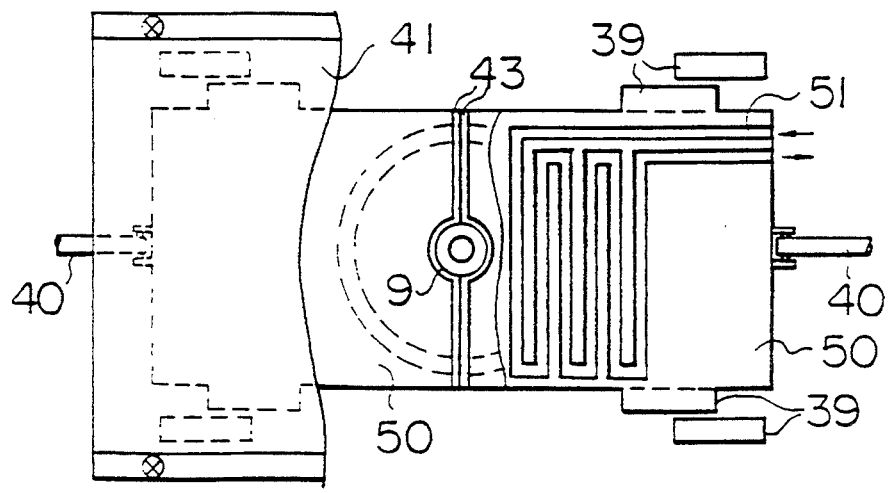

An embodiment 4 of the present invention is designed in such a way that instead of the shutters 13 for intercepting the reactive gas employed in the embodiments 1, 2 and 3, shutters 50 which can be cooled is provided, and the inactive gases are sprayed on the surface of the sample 24 (refer to FIGS. 11a and 11b). First, a channel is formed in each shutter 50 to form a passage 51 for passing a cooling medium therethrough. Then, cooling material such as liquid nitrogen is supplied through the passage 51, and the surface of each shutter 50 is cooled below the evaporation temperature of the reactive gas by the heat conduction, whereby the reactive gases supplied from the nozzle 15 are, when striking against the surface of each shutter 50, adsorbed thereon, so that the inflow of the reactive gas into the MCP chamber 27 can be further effectively reduced. Moreover, a valve and an inactive gas bomb (not shown) are connected to the,nozzle 52, and when the operation is changed from the processing to the observation, the reactive gases which remains on the surface of the sample 24 and the periphery thereof are blown away by the inactive gases supplied from the nozzle 52 to be evacuated to the evacuation system through the valve 31, whereby it is possible to surely prevent MCP from being degraded due to the adsorption of the reactive gas on the active surface of the inwall of the channel of MCP.

Embodiment 5

The above-mentioned embodiment 1 shown in FIGS. 1 to 4b is designed in such a way that during the observation of the sample, the shutters 13 are opened, and the MCP chamber 27 is not evacuated. However, if the conductance of the gas outflow/inflow part between the MCP chamber 27 and the main chamber 28 is sufficiently small, even when the MCP chamber 27 and the main chamber 28 are differentially evacuated independently of each other, the associated pumps are not pulled against each other. Then, in the present embodiment, during the observation as well, the MCP chamber 27 is differentially evacuated. FIG. 13 shows the sequence of the states of the elements of the system during the observation and during the processing. In this connection, during the processing, the application of the voltage to MCP 11 may not be performed as in the embodiment 2 shown in FIG. 5.

The system construction of the present embodiment is the same as in the embodiment 1.

Embodiment 6

In the embodiment 1 shown in FIGS. 1 to 4b, as the sealant 43 for being pressed against the periphery of the optical path pipe 9, such a member that has the rectangular configuration in cross section is employed. However, alternatively, a sealant 56 which has the sharp-pointed configuration in cross section as shown in FIG. 14a, or a sealant 57 which has the rounded configuration in cross section as shown in FIG. 14b may also be employed. Moreover, as the sealants of the shutters through which the two shutters are pressed against each other, one employs the sealant which has the rectangular configuration in cross section and the other employs the sealant which has such a configuration in cross section as shown in FIG. 14a or 14b, or the both sealants employ the member shown in FIG. 14b. The suitable sealant is selected out of them, and the force for pressing the sealant thus selected is suitably adjusted, whereby it is possible to improve the sealing performance and the wear and abrasion resistance.

Moreover, the cross sectional configurations of those sealants are applicable to the shutter which employs one of the sealants of other embodiments.

Embodiment 7

Figure 15A:
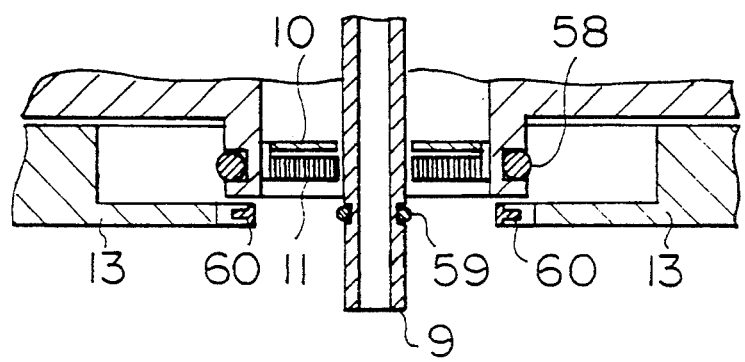
FIGS. 15a and 15b are respectively a cross sectional view and a plane view of a system of a seventh embodiment each showing a state during the observation.
Figure 15B:
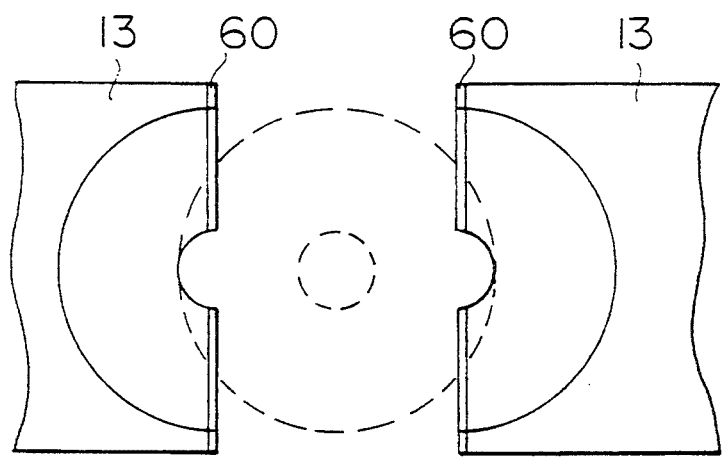
Figure 16A:
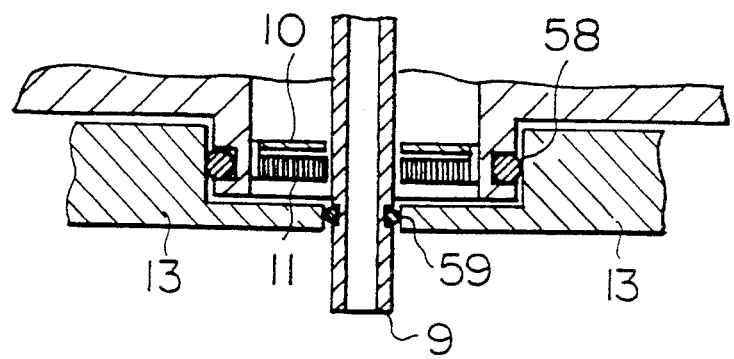
FIGS. 16a, 16b and 16c are respectively a cross sectional view and a plane view of the system of the seventh embodiment each showing a state during the processing, and a cross sectional view of the system of the seventh embodiment with respect to a plane which includes a center axis of a pipe 9 of FIG. 16a and is perpendicular to the drawing.
Figure 16B:
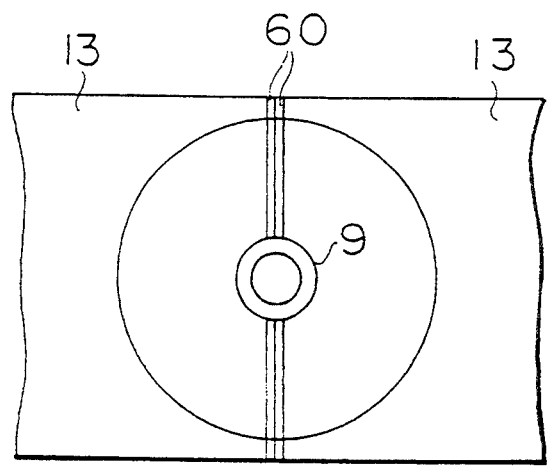
Figure 16C:
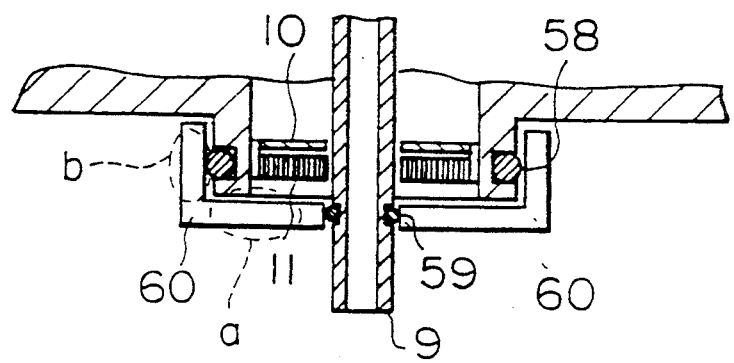

FIG. 15a is a cross sectional view showing schematically the states of the elements of the system during the observation. FIG. 15b is a cross sectional view showing schematically the states of the elements of the system during the processing. FIGS. 15b and 16b are respectively plane views of the system when viewed from the upper side of the shutters 13. FIG. 16c is a cross sectional view of the system with respect to a plane which includes the center axis of the pipe 9 of FIG. 16a and is perpendicular to the drawing. In the embodiment 1 shown in FIGS. 1 to 4b, the gases which intends to flow from the upper surfaces of the shutters 13 into the MCP chamber 27 are intercepted by the plane sealant in the form of the O ring 42. In the present embodiment, however, such construction is adopted that a cylindrical surface to which an O ring 58 is to be fitted is formed in the part opposite to the shutters, and when shutting the shutters 13, the shutters 13 are pressed against the O ring 58 to perform the cylindrical-surface sealing. Therefore, when the shutters 13 are being shut, the inflow of the gas from the upper surfaces of the shutters 13 is intercepted by the O ring 58, and the inflow of the gas from the periphery of the optical path pipe 9 is intercepted by the O ring 59. Moreover, in the parts through which the shutters 13 are pressed against each other, as shown in FIG. 16c, two sealants 60 and 60 each having an L-like configuration in cross section are mounted to each shutter 13, so that the inflow of the gas from the lower side of the shutters 13 is intercepted by a part a in FIG. 16c, and the inflow of the gas from the side faces of the shutters 13 is intercepted by a part b in FIG. 16c.

The sealing construction of the present embodiment is applicable to the shutters of the embodiments 1, 3 and 4.

Embodiment 8

Figure 17A:
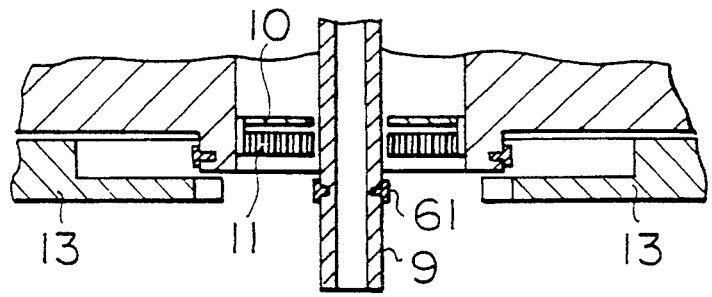
FIGS. 17a, 17b and 17c are respectively a cross sectional view and a plane view of a system of an eighth embodiment each showing a state during the observation, and a cross sectional view of the system of the eighth embodiment with respect to a plane which includes the center axis of the pipe 9 of FIG. 17a and is perpendicular to the drawing.
Figure 17B:
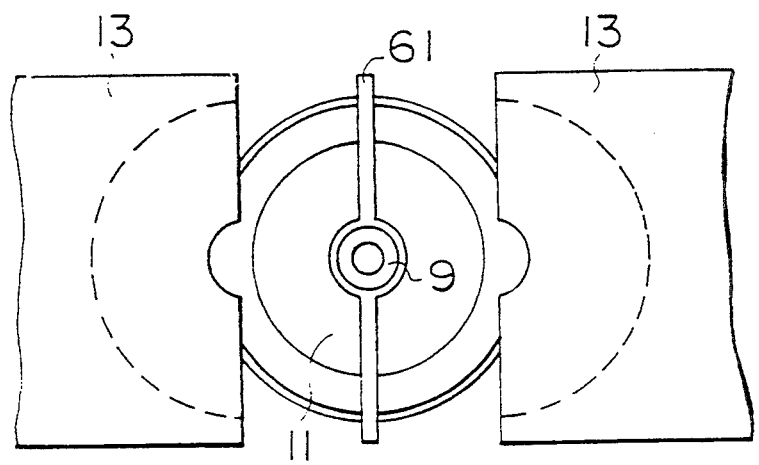
Figure 17C:
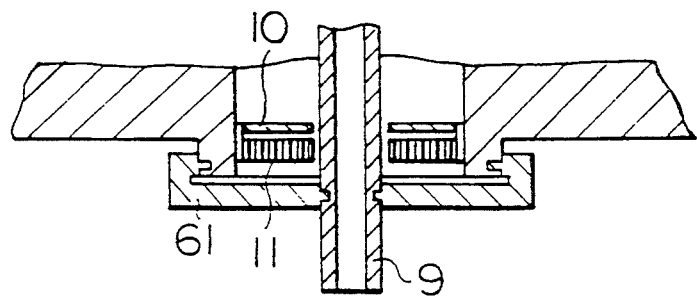
Figure 18A:
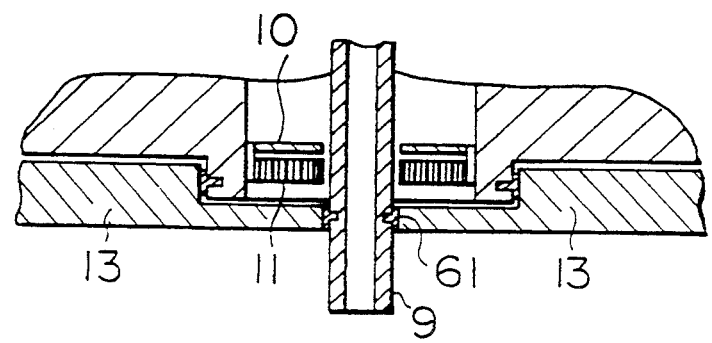
FIGS. 18a and 18b are respectively a cross sectional view and a plane view of the-system of the eighth 8 each showing a state during the processing.
Figure 18B:
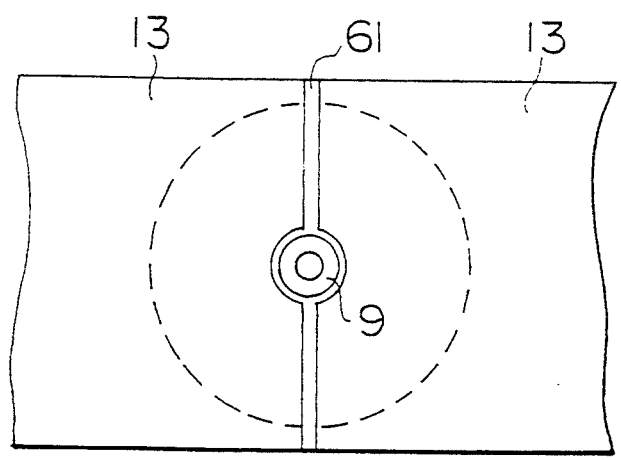

Although in the embodiment 7 shown in FIGS. 15a to 16c, the two O rings 58 and 59 and the four L-like sealants 60 are employed, in the present embodiment, those elements are combined into one element. FIG. 17a is a cross sectional view showing schematically the state of the elements of the system during the observation. FIG. 18a is a cross sectional view showing schematically the state of the elements of the system during the processing. FIGS. 17b and 18b are plane views of the system when viewed from the lower side of the shutters 13. FIG. 17c is a cross sectional view of the system with respect to a plane which includes the center axis of the pipe 9 of FIG. 17a and is perpendicular to the drawing. A sealant 61 which has a configuration in cross section as shown in FIG. 17a and is formed integrally with the L-like sealants 60, which are mounted to each shutter 13 in the embodiment 7, is fitted to the periphery of the optical path pipe 9. Therefore, there is no need for fitting the sealant to each shutter 13.

The sealing construction of the present embodiment is applicable to the shutters of the embodiments 1, 3 and 4.

Embodiment 9

Figure 19A:
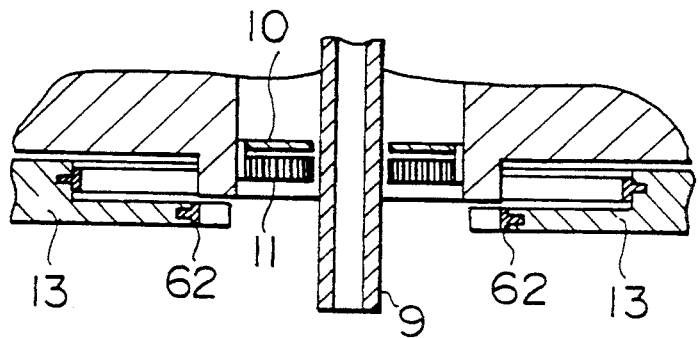
FIGS. 19a, 19b and 19c are respectively a cross sectional view and a plane view of a system of a ninth embodiment each showing a state during the observation, and a perspective view showing a configuration of a sealant of the embodiment.
Figure 19B:
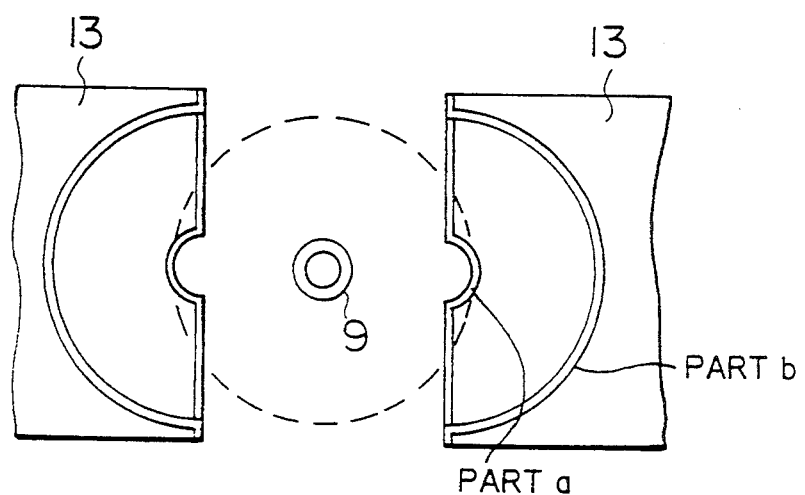
Figure 19C:
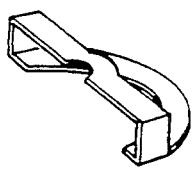
Figure 20A:
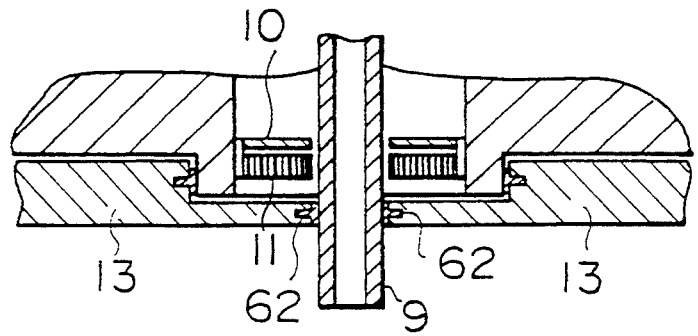
FIGS. 20a, 20b and 20c are respectively a cross sectional view and a plane view of the system of the ninth embodiment each showing a state during the processing, and a cross sectional view of the system of the ninth embodiment with respect to a plane which includes the center axis of the pipe 9 of FIG. 20a and is perpendicular to the drawing.
Figure 20B:
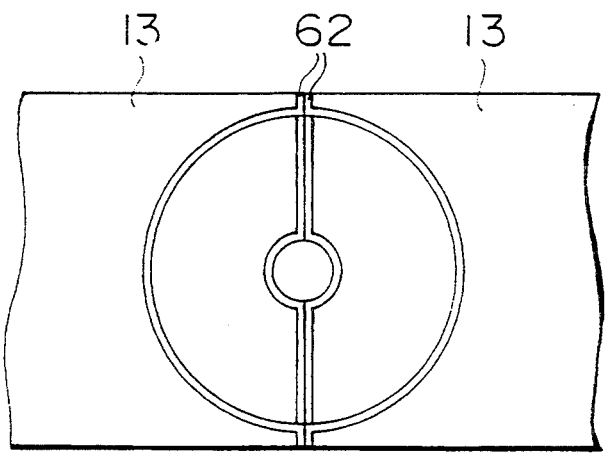
Figure 20C:
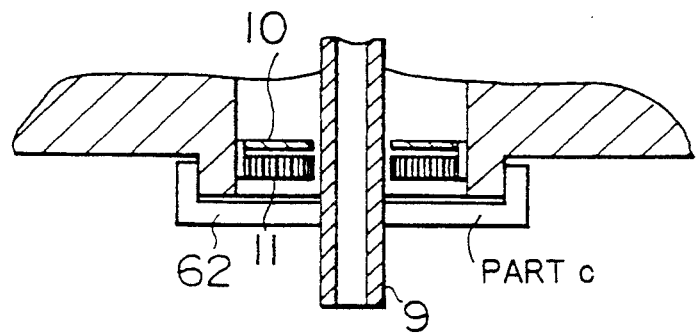

In the above-mentioned embodiment 8, the integral one-piece sealant 61 is fitted to the periphery of the optical path pipe 9. In the present embodiment, conversely, that sealant 61 is divided into two parts which are fitted to the respective shutters 13. FIG. 19a is a cross sectional view showing schematically the states of the elements of the system during the observation. FIG. 20a is a cross sectional view showing schematically the states of the elements of the system during the processing. FIGS. 19b and 20b are plane views of the system when viewed from the upper side of the shutters 13. FIG. 20c is a cross sectional view of the system with respect to a plane which includes the center axis of the pipe 9 of FIG. 20a and is perpendicular to the drawing. A sealant 62 which has a a configuration as shown in FIG. 19c is fitted to each shutter 13. In this connection, this sealant 62 is constructed in such a way that semicircular parts a and b which are formed in a concentric configuration so as to have respective radii different from each other as shown in FIG. 19b, and an L-like part c as shown in FIG. 20c are integrated with each other. Therefore, in the present embodiment, by contrast to the embodiment 8, no sealant is fitted to the optical path pipe 9.

The sealing construction of the present embodiment is applicable to the shutters of the embodiments 1, 3 and 4.

Embodiment 10

Figure 21A:
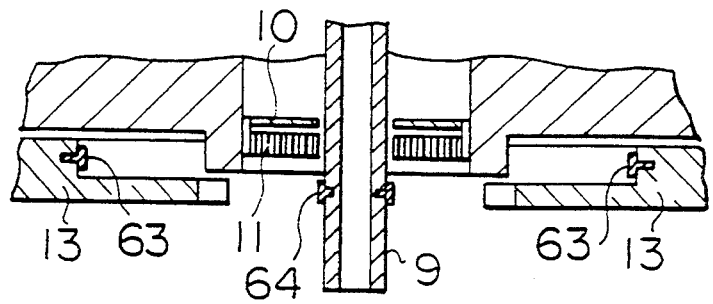
FIGS. 21a, 21b and 21c are respectively a cross sectional view and a plane view of a system of a tenth embodiment each showing a state during the observation, and a cross sectional view of the system of the embodiment with respect to a plane which includes the center axis of the pipe 9 of FIG. 21a and is perpendicular to the drawing.
Figure 21B:
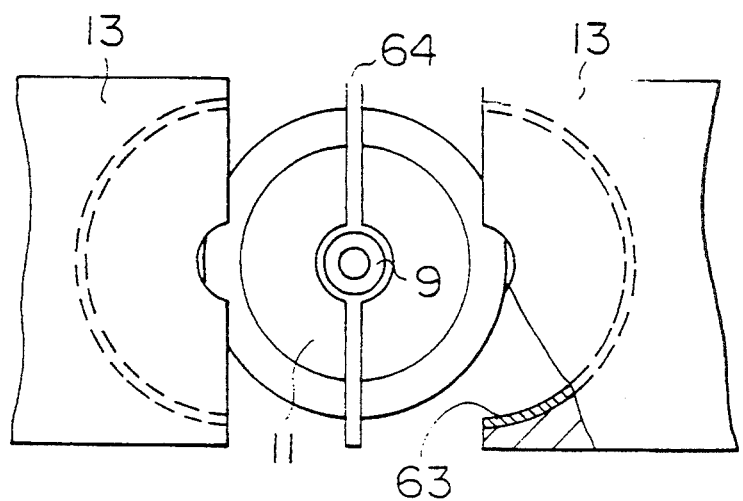
Figure 21C:
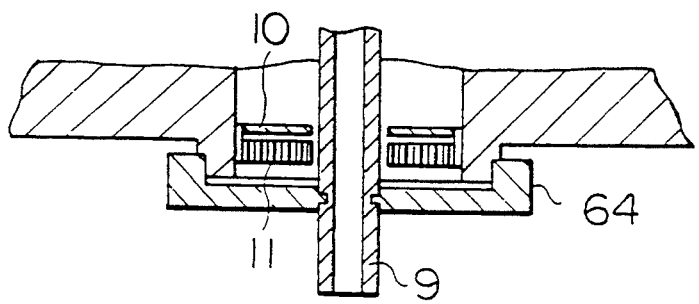
Figure 22A:
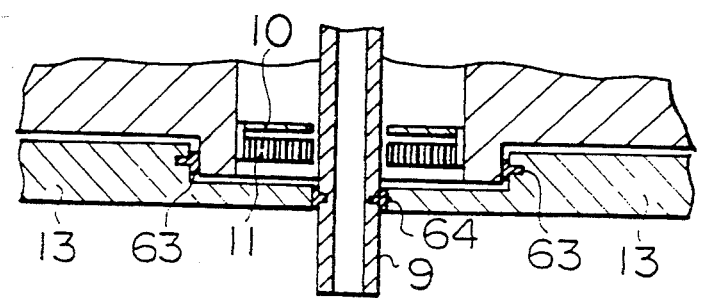
FIGS. 22a and 22b are respectively a cross sectional view and a plane view of the system of the tenth embodiment each showing a state during the processing.
Figure 22B:
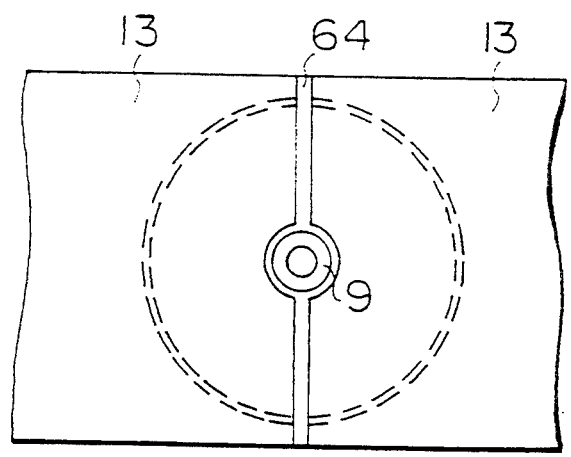

FIG. 21a is a cross sectional view showing schematically the states of the elements of the system during the observation. FIG. 22a is a cross sectional view showing schematically the states of the elements of the system during the processing. FIGS. 21b and 22b are plane views of the system when viewed from the lower side of the shutters 13. FIG. 21c is a cross sectional view of the system with respect to a plane which includes the center axis of the pipe 9 of FIG. 21a and is perpendicular to the drawing. The present embodiment is designed in such a way that only the part for intercepting the inflow of the gas from the upper surfaces of the shutters 13 in the embodiment 8 shown in FIGS. 17a to 18b is divided into two, parts which are fitted to the respective shutters 13. A semicircular sealant 63 is fitted to each shutter 13 as shown in FIGS. 21a and 21b, and a sealant 64 in which two L-like parts are coupled to the opposite positions of a ring-like part is fitted to the periphery of the optical path pipe 9.

The sealing construction of the present embodiment is applicable to the shutters of the embodiments 1, 3 and 4.

Embodiment 11

Figure 23A:
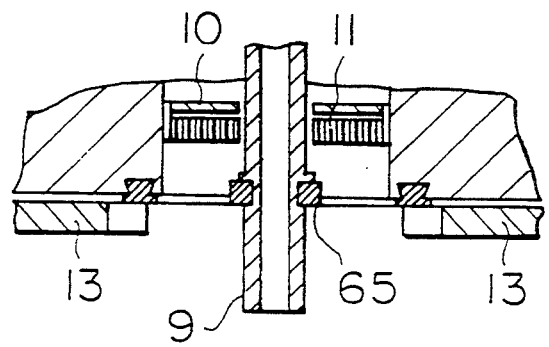
FIGS. 23a and 23b are respectively a cross sectional view and a plane view of a system of an eleventh embodiment each showing a state during the observation.
Figure 23B:
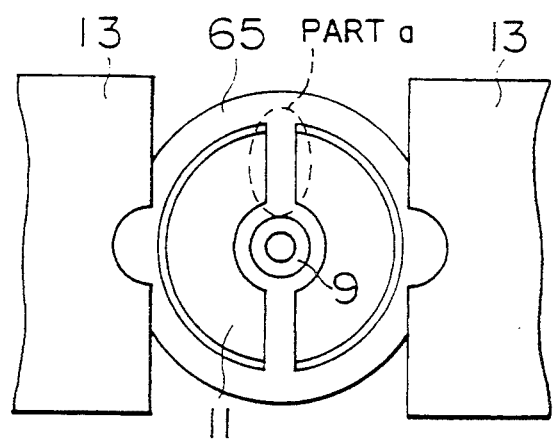
Figure 24A:
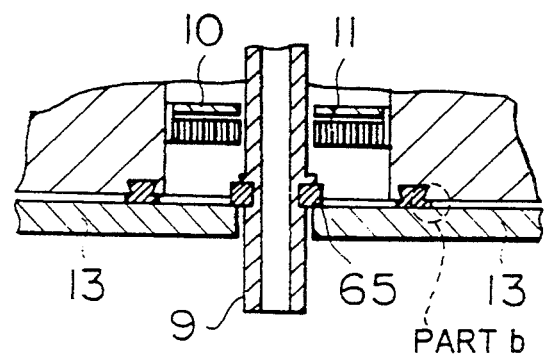
FIGS. 24a and 24b are respectively a cross sectional view and a plane view of the system of the eleventh embodiment each showing a state during the processing.
Figure 24B:
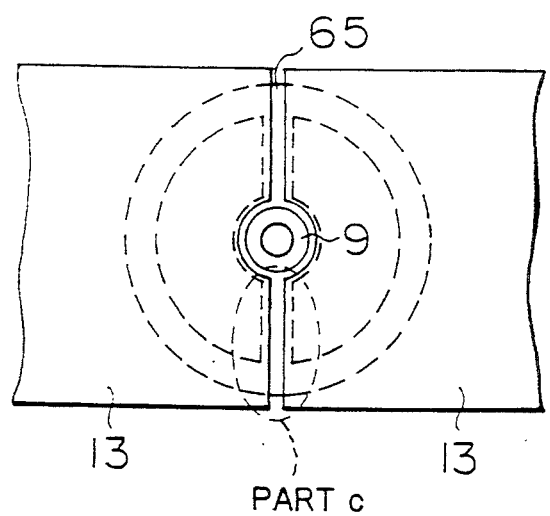

As described above, the embodiment 1 shown in FIGS. 1 to 4b is designed in such a way that for the interception of the inflow of the gas from the periphery of the optical path pipe 9, the sealant 43 which has the cylindrical surface and is mounted to the shutter 13 is pressed against the periphery of the optical path pipe 9, i.e., the cylindrical surface sealing is performed. In the present embodiment, however, the plane sealing is adopted. FIG. 23a is a cross sectional view showing schematically the states of the elements of the system during the observation. FIG. 24a is a cross sectional view showing schematically the states of the elements of the system during the processing. FIGS. 23b and 24b are plane views of the system when viewed from the lower side of the shutters 13. A sealant 65 is constructed in such a way that two concentric rings are, as shown in FIG. 23b, connected to each other by a spoke part a extending radially. When shutting the shutters 13, as shown in FIG. 24a, the upper surfaces of the shutters 13 contact the lower surface of the sealant 65. As a result, it is possible to prevent the inflow of the gas from a part b of the upper surface of the shutter 13 and the inflow of the gas from a part c between the periphery of the optical path pipe 9 and the shutters 13.

The sealing construction of the present embodiment is applicable to the shutters of the embodiments 1, 3 and 4.

Embodiment 12

Figure 25A:
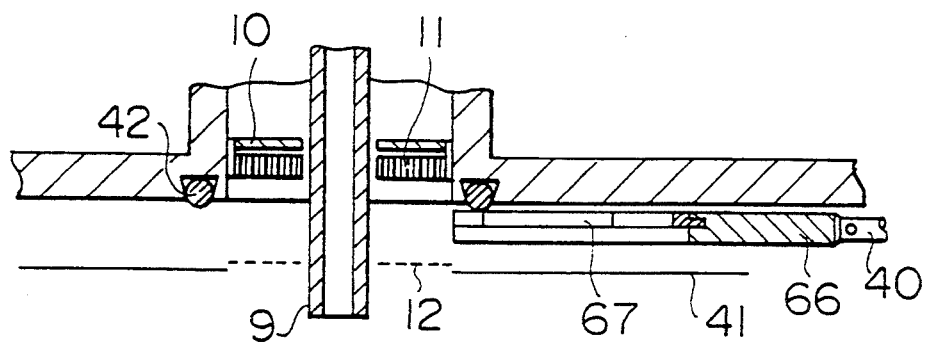
FIGS. 25a and 25b are respectively a cross sectional view and a plane view of a system of a twelfth embodiment each showing a state during the observation.
Figure 25B:
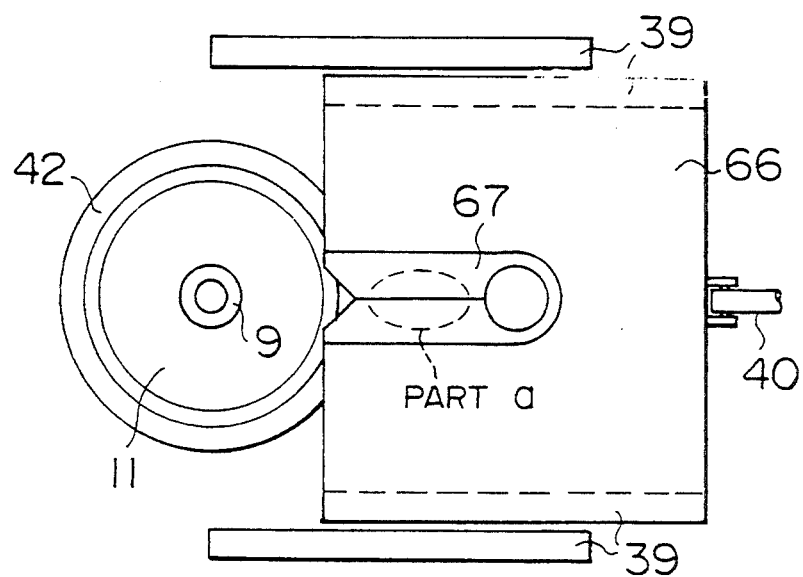
Figure 26:
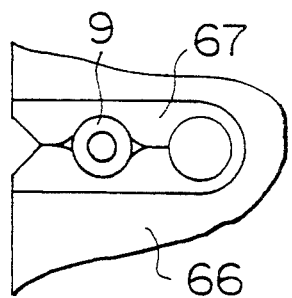
FIGS. 26 is a plane view of the system of the twelfth embodiment showing a transient state when the process is being changed from the observation to the processing.
Figure 27A:
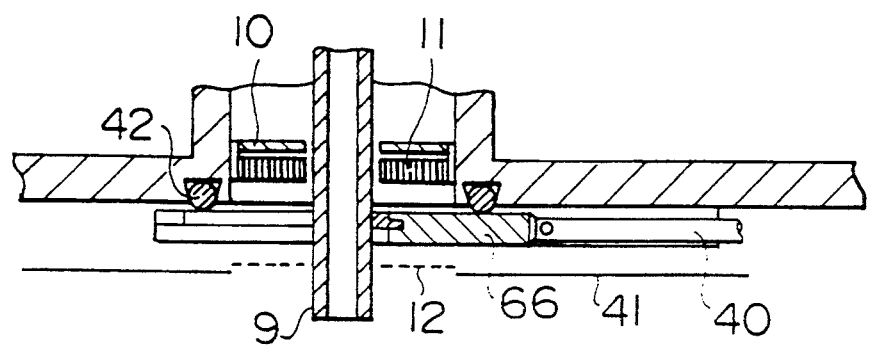
FIGS. 27a and 27b are respectively a cross sectional view and a plane view of the system of the twelfth embodiment each showing a state during the processing.
Figure 27B:
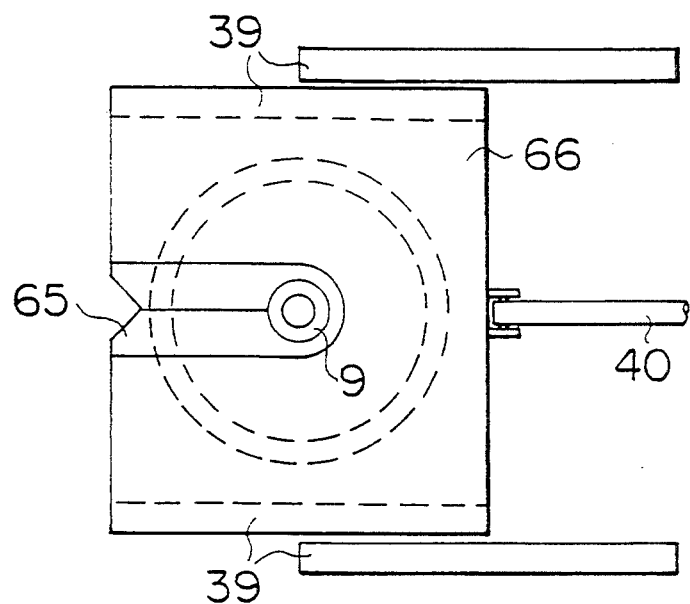

The above-mentioned embodiments adopt such construction that the two shutters 13 are provided, and the shutters are shut from the both sides. However, the present embodiment adopts such construction that only one shutter is provided, and the shutter is shut from one side. FIG. 25a is a cross sectional view showing schematically the states of the elements of the system during the observation. FIG. 27a is a cross sectional view showing schematically the states of the elements of the system during the processing. FIGS. 25b and 27b are plane views of the system when viewed from the lower side of the shutter. First, during the observation, the shutter is housed in the right side in FIGS. 25a and 25b. A sealant 67 which has a circular hole for receiving the optical path pipe 9 is mounted to the shutter 66 as shown in FIG. 25b. When the shutter 66 is intended to be shut, since the optical path pipe 9 becomes an obstacle, the sealant 67 is cut to the circular hole (part a in FIG. 25b). FIG. 26 shows the transient state of the sealant 67 when the shutter 66 is being shut.

The sealing construction of the present embodiment is applicable to the shutters of the embodiments 1, 3 and 4.

Embodiment 13

Figure 28A:
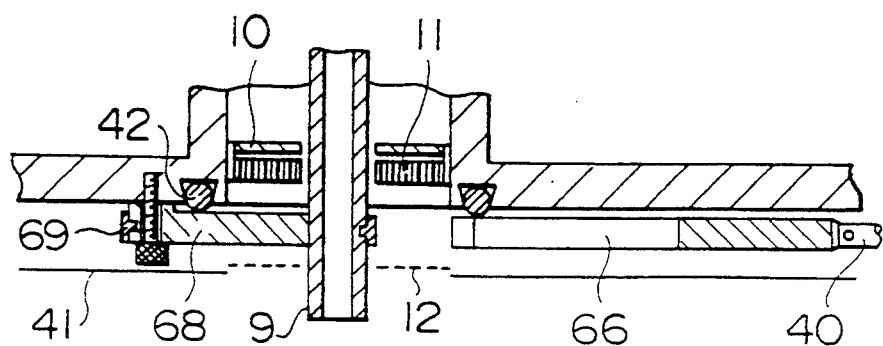
FIGS. 28a and 28b are respectively a cross sectional view and a plane view of a system of a thirteenth embodiment each showing a state during the observation.
Figure 28B:
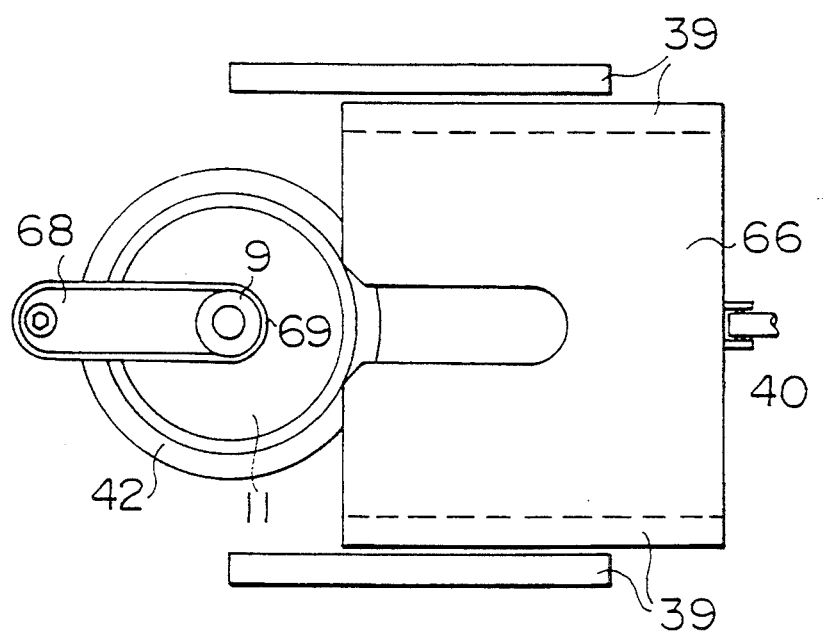
Figure 29A:
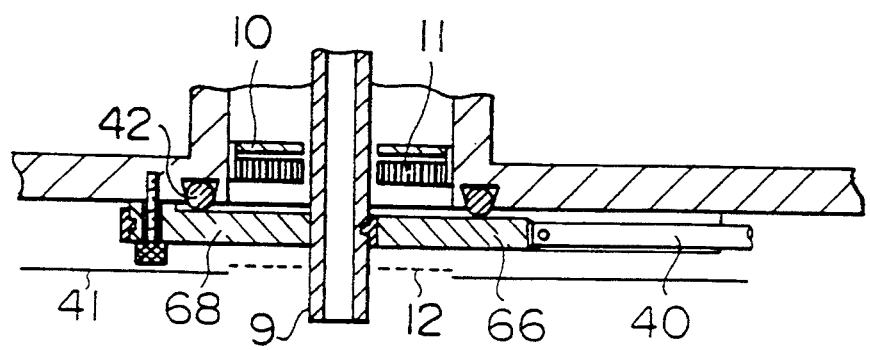
FIGS. 29a and 29b are respectively a cross sectional view and a plane view of the thirteenth system of the embodiment each showing a state during the processing.
Figure 29B:
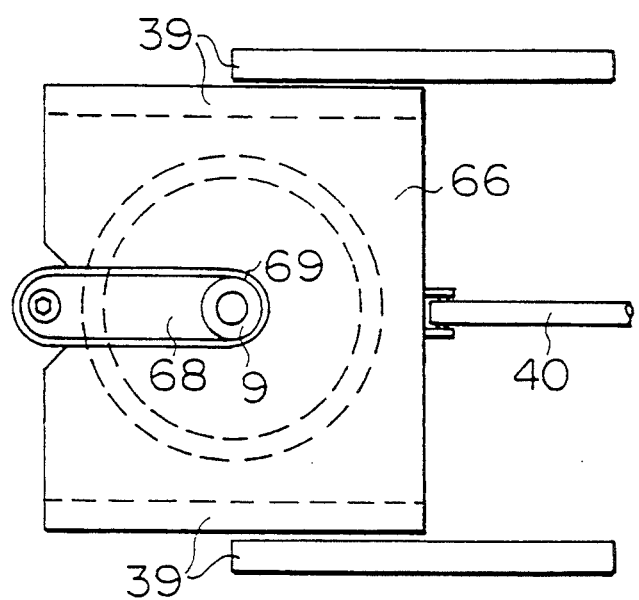

FIG. 28a is a cross sectional view showing schematically the states of the elements of the system during the observation. FIG. 29a is a cross sectional view showing schematically the states of the elements of the system during the processing. FIGS. 28b and 29b are plane views of the system when viewed from the lower side of the shutter 66. Although in the above-mentioned embodiment 12 shown in FIGS. 25a to 27b, the sealant 67 is mounted to the shutter 66, in the present embodiment, the sealant is not mounted to the shutter 66, but as shown in FIG. 28a, a beam 68 is provided and a sealant 69 is installed so as to be wound on both the beam and the optical path pipe 9. As a result, the inflow of the gas from the lower surface of the shutter 66 is intercepted as shown in FIG. 29b. Moreover, such construction may be adopted that the beam 68 is left as it is, and the sealant 69 is modified into the U-like configuration to be mounted to the shutter 66.

The sealing construction of the present embodiment is applicable to the shutters of the embodiments 1, 3 and 4.

Embodiment 14

Figure 30:
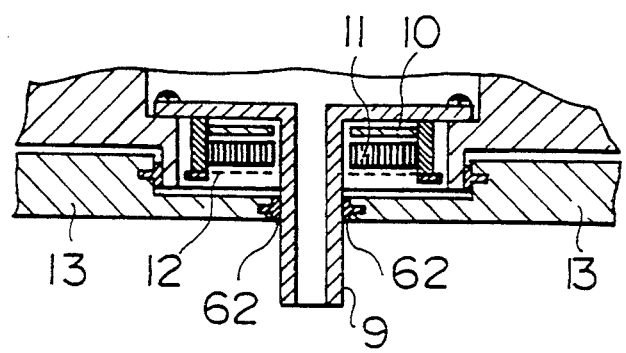
FIG. 30 is a cross sectional view of a system of a fourteenth embodiment showing a state during the processing.

In the above-mentioned embodiments, the leading-in electrode 12 is disposed below the shutters 13 so as to prevent both the change of the electric field over the sample due to the opening and shutting of the shutters 13, and the change of the strike point of the ion beam 2 due to the change of the electric field as much as possible. FIG. 30 is a cross sectional view showing schematically the states of the elements of the system of the present embodiment during the processing. In the present embodiment, MCP 11 employs the construction as is shown generally in the goods on the market. That is, the leading-in electrode 12 is disposed just before MCP 11 and the above shutter 13. If the size, the applied voltage and the arrangement of the leading-in electrode by which the strike point of the ion beam 2 is prevented from being changed are previously, empirically obtained on the basis of the analysis of the electric field and the orbit tracking of the ion beam 2, even when the electric field over the sample is changed, it is possible to prevent the strike point from being changed.

Embodiment 15

Figure 31A:
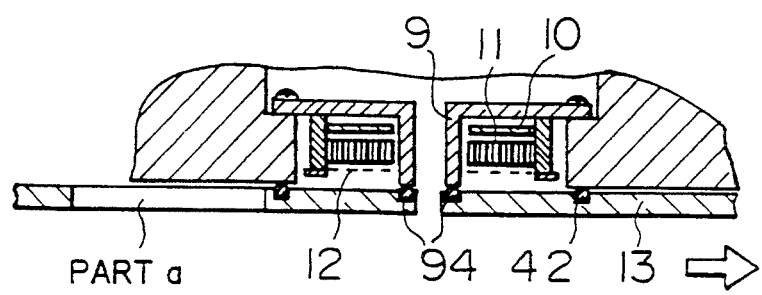
FIGS. 31a and 31b are respectively a cross sectional view and a plane view of a system of a fifteenth embodiment each showing a state during the processing.
Figure 31B:
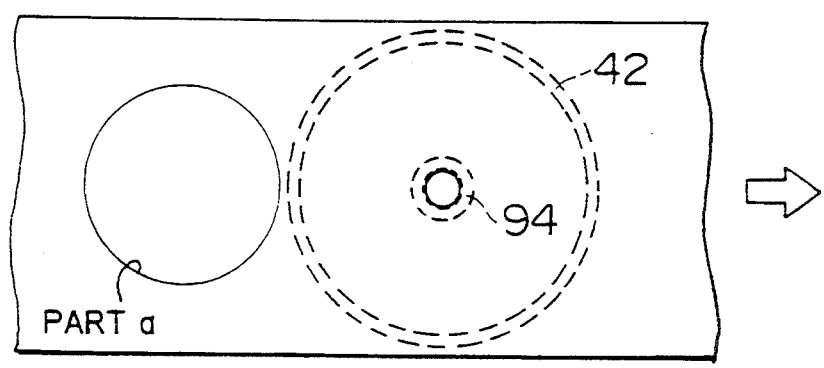

FIG. 31a is a cross sectional view showing schematically the states of the elements of the system during the processing. FIG. 31b is a plane view of the system when viewed from the lower side of the shutter 13. In the same manner as that in the embodiment 14 shown in FIG. 30, the present embodiment is designed in such a way that the strike point of the ion beam 2 is not changed by the opening and shutting of the shutter 13. A point of difference of the present embodiment from the above-mentioned embodiments is that since the optical path pipe 9 does not interfere with the shutter 13, only one shutter 13 is required to provide the simple construction. In the present embodiment, the O ring 42 and an O ring 94 are fitted to the shutter 13. However, those O rings may be fitted to the elements confronting with the shutter 13. If the ion beam 2 is directly applied to the O ring 94, if the O ring 94 is made of insulating material, it is charged up to curve the orbit of the ion beam 2. It is difficult to calculate the charge-up amount, and therefore, it is difficult to estimate the orbit of the ion beam 2. Accordingly, the O ring 94 needs to be disposed so as not to come into the field of vision of the ion beam 2. During the observation, the shutter 13 is moved to the right side in the figure and the center of a circular hole a is made to coincide with the center of the ion beam 2 using a stopper so that the secondary ions can be led in.

Embodiment 16

Figure 32A:
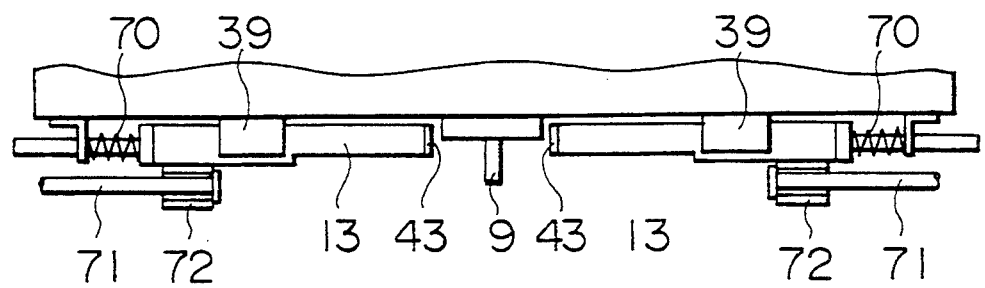
FIGS. 32a and 32b are side elevational views of a system of a sixteenth embodiment showing a state during the observation and a state during the processing, respectively.
Figure 32B:
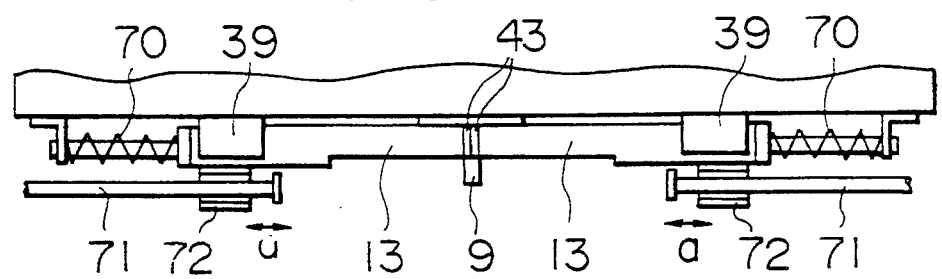

In the embodiment 1 shown in FIGS. 1 to 4b, instead of the driver as shown in FIG. 12, a straight leading-in terminal for a vacuum, or a rotation leading-in terminal for a vacuum (in this case, a ball screw for converting the rotation motion into the rectilinear motion, and the like are required) may also be used. But, in the case where for the purpose of improving the sealing characteristics, the pressing force of the shutter is adjusted, as shown in FIGS. 32a and 32b, the shutters 13 are pressed against each other by the forces of respective springs 70. FIG. 32a is a side elevational view of the system during the observation of the sample. FIG. 32b is a side elevational view of the system during the processing of the sample. First, in the observation, shafts 71 hook respective stoppers 72, i.e., the head parts of the respective shafts 71 are brought into contact with front edges of the respective stoppers 72 to pull them against the forces of the respective springs 70 thereby to open the respective shutters 13. Next, in the processing, the shafts 71 are slid towards the inside. In this connection, after the shutters 13 have been shut, the shafts 71 are continued to be slid by a length a in the figure. At this time, the pre-load is applied to the spring 70, and therefore, the pressing force can be given to the sealant 43.

The mechanism for driving a shutter of the present embodiment is applicable to the shutters of the embodiments 1 to 4, and 7 to 15.

Embodiment 17

Figure 33A:
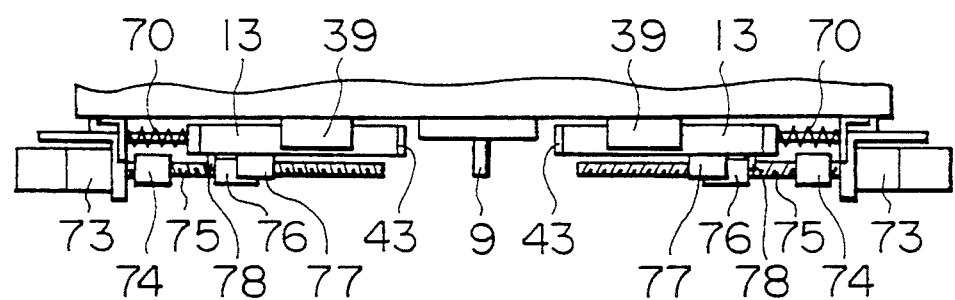
FIGS. 33a and 33b are side elevational views of a system of a seventeenth embodiment showing a state during the observation and a state during the processing, respectively.
Figure 33B:
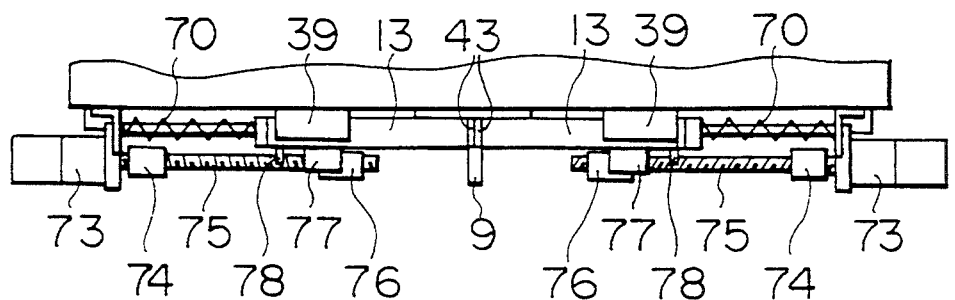

Although in the above-mentioned embodiments, the opening and shutting of the shutter are performed using the driver provided outside the chamber, in the present embodiment, a drive unit is provided inside the chamber. One example of this drive unit is shown in FIGS. 33a and 33b. A motor 73 is coupled to a ball screw 75 through a coupling 74, and a nut part 76 of the ball screw 75 is supported by a cross roller guide 77 so as to be able to slide on the shutter 13. In the same manner as that in the embodiment 16, when opening the shutters 13, the nut parts 76 hook the respective stoppers 78 on the shutters 13 to pull the shutters against the forces of the springs 70, thereby to open the shutters 13. When shutting the shutters 13, the nut parts 76 are run freely, and the sealants 43 are pressed against each other by the pre-loads of the springs 20. By adopting this construction, the rotation motion of the motor 73 can be converted into the rectilinear motion of the shutter 13 using the ball screw, and only the conductors for power supply are led to the outside of the vacuum. Therefore, the construction becomes relatively simple.

The shutter driving mechanism of the present embodiment is applicable to the shutters of the embodiments 1 to 4, and 7 to 15.

Embodiment 18

Figure 34:
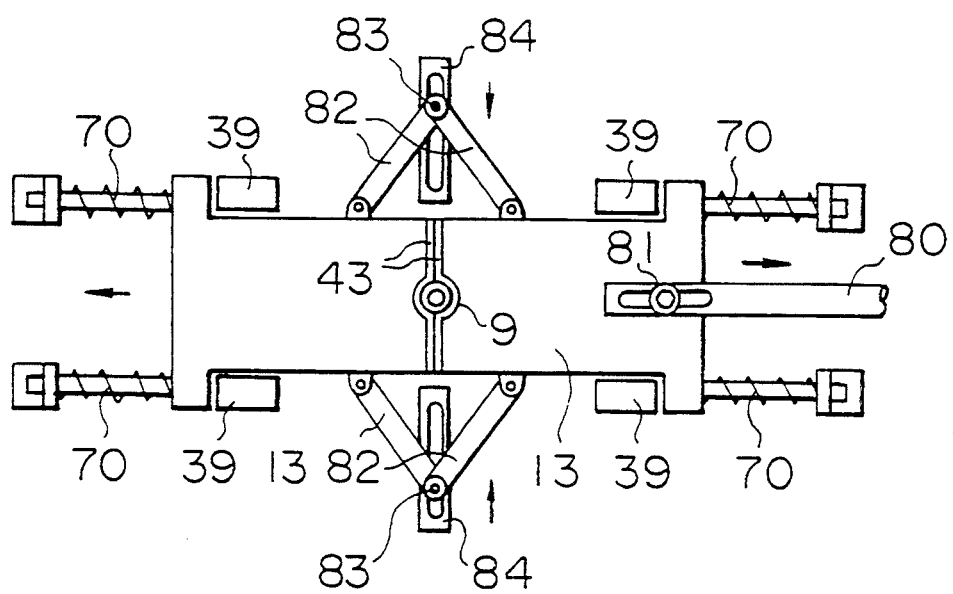
FIG. 34 is a plane view of a system of an eighteenth embodiment showing a state during the processing.
Figure 35:
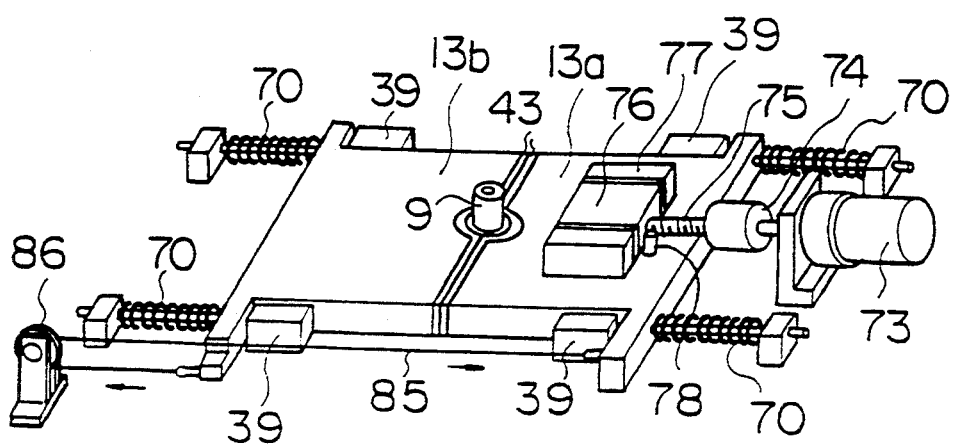
FIG. 35 is a perspective view of a system of an nineteenth embodiment showing a state during the processing.

In the above-mentioned embodiments, in the case where the two shutters are employed, the opening and shutting of the shutters are performed using the separate drivers. In the present embodiment, however, such construction is adopted that a link mechanism is employed to drive both the shutters 13 by one driver. FIG. 34 shows a plan view of the system of the present embodiment during the processing of the sample. The motion of a shaft 80 is transmitted to the shutters 13 through a stopper 81. Arms 82, which are coupled to the respective shutters 13, are coupled to each other at a supporting point 83, and the supporting point 83 is moved along a guide 84, whereby both the shutters 13 can be driven. Arrow heads shown in the figure represent the directions of the motion of the elements when opening the shutters 13.

The shutter driving mechanism of the present embodiment is applicable to the shutters of the embodiments 1 to 4, and 7 to 15.

Embodiment 19

Figure 36:
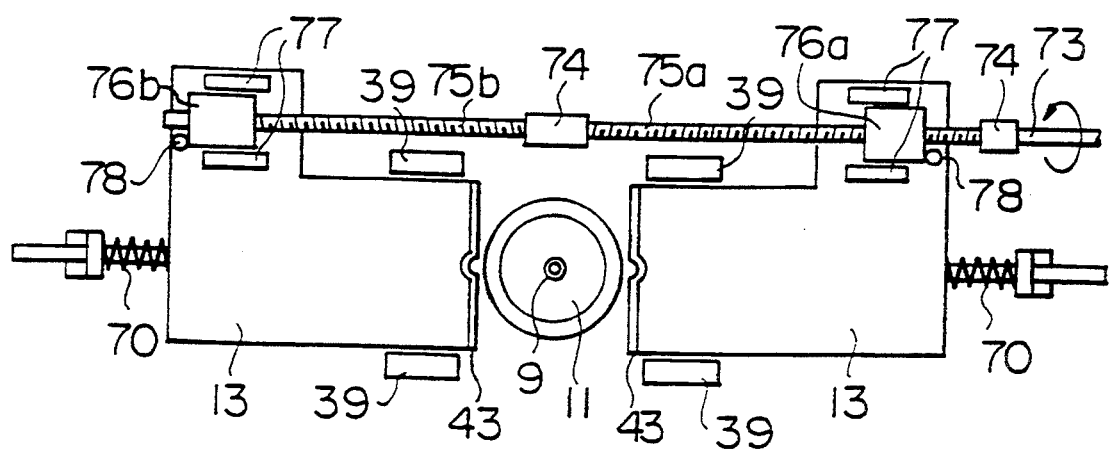
FIG. 36 is a plane view of a system of a twentieth embodiment showing a state during the observation.

The present embodiment adopts such construction that by using a wire, both the shutters are driven by one driver. FIG. 36 shows a perspective view of the system of the present embodiment during the processing of the sample. A driving mechanism for one shutter 13a is identical in construction to that of the embodiment 17. One end of a wire 85 is fastened to the driving shutter 13a and the other end of the wire 85 is fastened to the driven shutter 13b through a pully 86. When the driving shutter 13a is opened, the driven shutter 13b is also opened by the tensile force of the wire 85. Instead of the wire 85, a belt or the like (and a pulley corresponding thereto) may be used.

The shutter driving mechanism of the present embodiment is applicable to the shutters of the embodiments 1 to 4, and 7 to 15.

Embodiment 20

As shown in FIG. 36, the present embodiment adopts such construction that ball screws 75a and 75b in which an inverse herical gash is threaded are used and for the opening and shutting of the two shutters 13, both the shutters 13 are driven by one driver. Other construction is identical to that of the embodiment 17 shown in FIGS. 33a and 33b. The ball screws 75a and 75b which are coupled to a coupling 74 and in which the inverse herical gash is threaded, and nut parts 76a and 76b corresponding thereto are provided, whereby the rotation motion of a motor (not shown) is converted into the rectilinear motion having the directions opposite to each other.

The shutter driving mechanism of the present embodiment is applicable to the shutters of the embodiments 1 to 4, and 7 to 15.

Embodiment 21

Figure 37A:
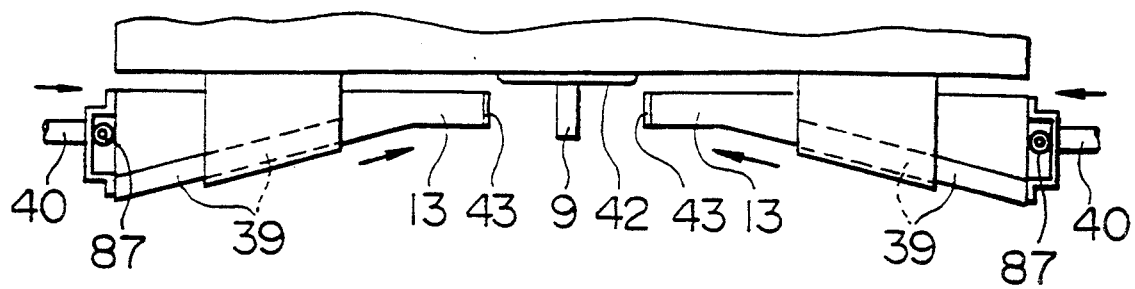
FIGS. 37a and 37b are side elevational views of a system of a twenty-first embodiment showing a state during the observation and a state during the processing, respectively.
Figure 37B:
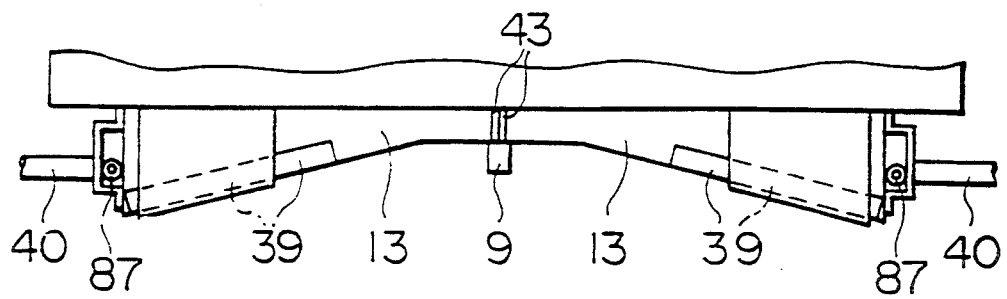

In the system in which the plane seals are provided on the upper surfaces of the shutters 13 as in the embodiment 1 and the like, when the shutter 13 is opened and shut, the O ring 42 as the plane seal is readily, relatively worn out. However, in the present embodiment, for the purpose of improving the wear and abrasion resistance, the construction as shown in FIGS. 37a and 37b is adopted. That is, since each cross roller guide 39 is mounted to the body diagonally, when the shutters 13 are fully opened, they are located in the relative lower positions as shown in FIG. 37a, and when the shutters 13 are perfectly shut so that the front ends of the two shutters 13 are pressed against each other, the shutters 13 are moved in such a way that the upper surfaces of the shutters 13 just contact the O ring 42 as shown in FIG. 37b. A bearing 87 is mounted to the front end of a push rod 40 in such a way that the shutters 12 can also be moved vertically, thereby to reduce the abrasion. When the shutter 13 is driven using the motor, one set of drivers may be mounted diagonally.

The shutter driving mechanism of the present embodiment is applicable to the shutters of the embodiments 1, 3, 4, 7, and 11 to 13.

Embodiment 22

Figure 38A:
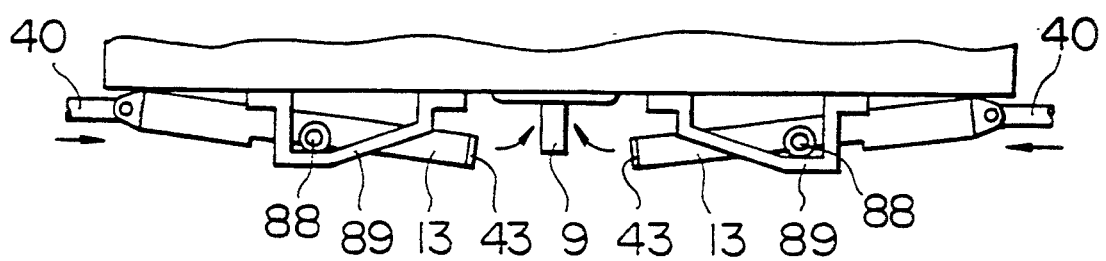
FIGS. 38a and 38b are side elevational views of a system of a twenty-second embodiment showing a state during the observation and a state during the processing, respectively.
Figure 38B:
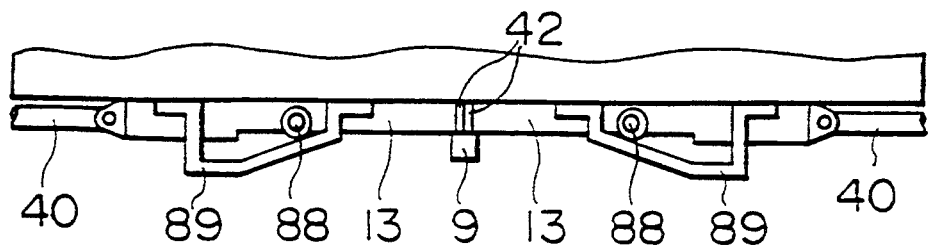

For the purpose of improving the wear and abrasion resistance in the same manner as in the embodiment 19, the present embodiment adopts the construction as shown in FIGS. 38a and 38b. Rollers 88 are provided at the ends of the shutters 13 to the rear ends of which the push rods 40 are coupled. The push rods 40 are moved horizontally, lineally. When the shutters 13 are being opened as shown in FIG. 38a, the shutters 13 are located in the lower positions than that of the seal 42 and are inclined. When the shutters 13 are being shut, as shown in FIG. 38b, the respective rollers 88 are moved along the slopes of the guides 89 so that the two shutters 13 are moved upwardly and contact the seal 42 when the front parts thereof are pressed against each other.

The shutter driving mechanism of the present embodiment is applicable to the shutters of the embodiments 1, 3, 4, 7, and 11 to 13.

Embodiment 23

Figure 39A:
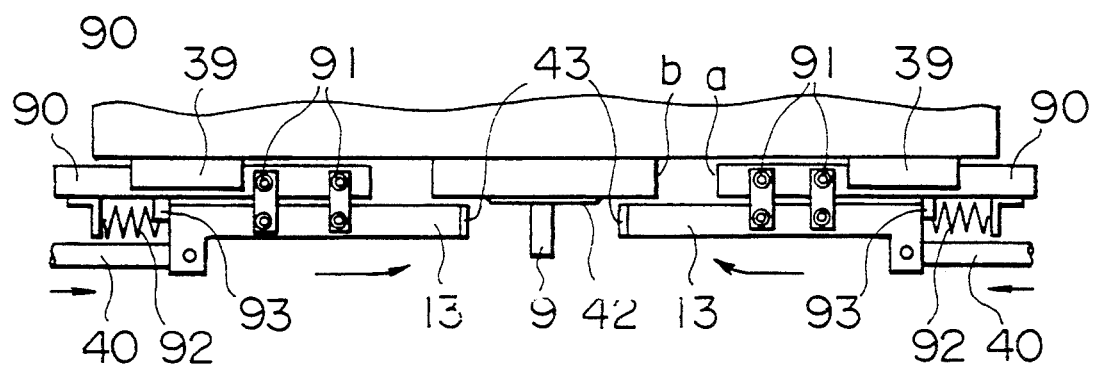
FIGS. 39a and 39b are side elevational views of a system of a twenty-third embodiment showing a state during the observation and a state during the processing, respectively.
Figure 39B:
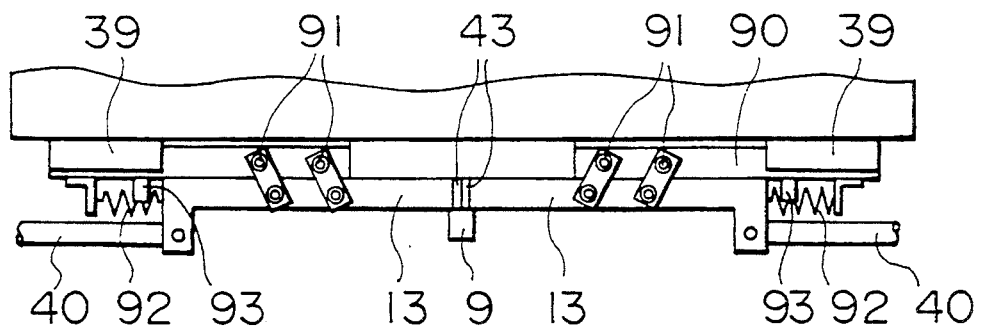

For the purpose of improving the wear and abrasion resistance of the plane seal part in the same manner as in the embodiments 21 and 22, the present embodiment adopts such construction as shown in FIG. 39. The shutter 13 is held to a slide base 90 at the four points, i.e., at the front and back and right and left points by arms 91 each having a bearing. The slide bases 90 are held by the pair of cross roller guides 39 so as to be moved in parallel. Moreover, a spring 92 is provided between the slide base 90 and the shutter 13, so that the tensile force is always applied to the shutter 13 in the direction of opening the shutter 13 and thus the shutter 13 is stopped at a stopper 93. The push rod 40 is coupled to the shutter 13. When the shutters 13 are being shut, the horizontal forces are applied from the push rods 40 to the shutters 13 so that the shutters 13 and the respective slide bases 90 are moved in parallel. Before the shutters 13 are perfectly shut, the full faces a of the slide bases 90 are brought into contact with the stopper parts b. Thereafter, since the shutters 13 are further pushed by the push rods 40, the springs 92 stretch and the arms 91 also pivot so that the upper surfaces of the shutters 13 are pressed against the seal surface.

The shutter driving mechanism of the present embodiment is applicable to the shutters of the embodiments 1, 3, 4, 7, and 11 to 13.

Incidentally, in the embodiments 2 to 23, the construction and the function other than those of the secondary ion detector are the same as those of the embodiment 1. Moreover, the processing sequence of the embodiments 4 and 6 to 23 is common to that of one of the embodiments 1 and 5.

In the above-mentioned embodiments, MCP is employed as the secondary ion detector. However, a channeltron or an electron multiplier is also available.

Moreover, in the above description, the leading-in electrode is employed. However, if the yield of the secondary ion can be sufficiently obtained and the resolution is not influenced, the leading-in electrode may be omitted as the case may be.

Moreover, although the above description has been given with respect to the etching, in the charged. particle beam assisted deposition as well which employs the gases for providing the deposition by the irradiation of the charged particle beam, the present invention is effective for the protection of the secondary ion detector.

In addition, although the above description has been given with respect to only the irradiation of the ion beam and the detection of the secondary ion, in the irradiation of the electron beam and the detection of the secondary electron as well, if the applied voltage to the charged particle detector is suitably changed, the same effects can be obtained.

Further, in the above description, the shutters are used to intercept the inflow of the reactive gas during the processing of the sample. However, such a method may be adopted that no shutter is used, the application of the voltage to the secondary particle detector is stopped, and after the processing has been completed and then the gases adsorbed on the detector are effectively evacuated, the suitable voltage is applied to the detector again and then the positioning for the processing is performed. According to this method as well, it is possible to reduce the degradation of the detector.

As set forth hereinabove, according to the present invention, when the reactive gases are introduced, and the reactive etching and the beam assisted deposition are performed by utilizing the charged beam, the charged particle detection can be protected from the reactive gas, and as a result, the stable system operation can be performed. Moreover, even in the non-operation, such a detector as to have no durability to the reactive gas can be used. Further, even for the detector which requires the high degree of vacuum in the operation, if that shutter mechanism and the additional exhaust system are employed, the secondary particle detector can be always operated. Therefore, the time can also be omitted which is required for the stabilization of the secondary particle detector resulting from the change between the operation and the non-operation.

Figure 40:
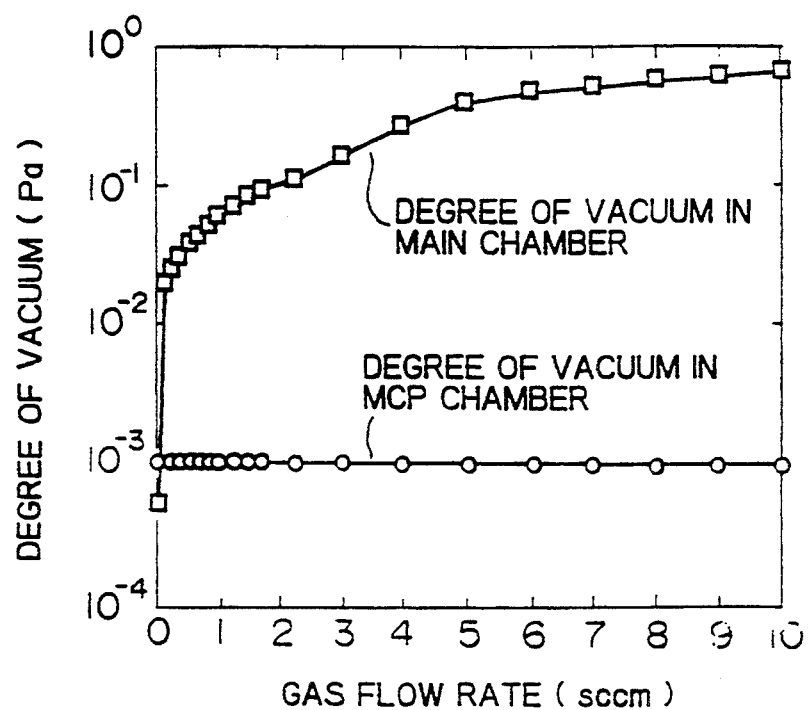
FIG. 40 is a graphical representation showing the gas interception characteristics by use of MCP shutters.
Figure 41:
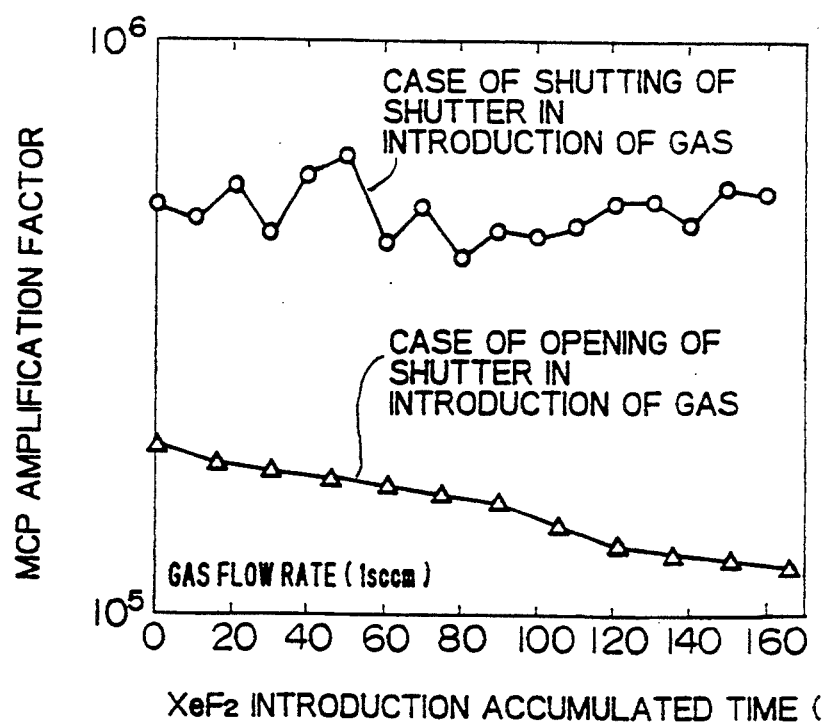
FIG. 41 is a graphical representation showing the change of an MCP amplification factor.

FIG. 40 is a graphical representation showing the pressure in the MCP chamber, when the shutters are shut and the reactive gases are introduced into the main chamber, in the construction of the embodiment 9 as one example of showing the effects of the present invention. When the gases were introduced at a gas flow rate of 10 sccm, the pressure in the main chamber was increased to 0.7 Pa, but the pressure in the MCP chamber could be kept at $1.0 \times 10^{-3}$ Pa of the initial pressure. Moreover, FIG. 41 is a graphical representation showing the change of the MCP amplification factor when the shutter mechanism of the present invention is applied to the actual processing sequence. As apparent from the figure, as far as the experiments were performed this time, the degradation of MCP was not recognized. As a result, the lifetime of MCP can be increased by several tens of times as compared with the case where no shutter mechanism is provided.

We claim:

1. A method of processing a sample using a charged beam and reactive gases, comprising the steps of:
   focusing a charged beam emitted from a charged beam source by a charged beam optical system to apply said focused charged beam to a sample;
   opening a shutter mechanism shielding a charged particle detector from reactive gases introduced to a surface of said sample;
   detecting charged particles emitted from said sample when applying said charged beam to said sample by said charged particle detector in order to observe said surface of said sample;
   shutting said shutter mechanism to shield said charged particle detector from reactive gases introduced to said surface of said sample, whereby said charged particle detector is shielded within a shielded chamber separated from a sample chamber;
   introducing said reactive gases to said surface of said sample being irradiated with said charged beam to process said surface of said sample; and
   evacuating said shielded chamber accommodating said charged particle detector to reduce an interreaction of said reactive gases with said charged particle detector.

2. A method as claimed in claim 1, wherein said shutter mechanism comprises a seal arrangement which sealingly separates said shielded chamber from said sample chamber when said shutter mechanism is shut.

3. A method as claimed in claim 1, wherein said evacuating step is conducted using a shielding chamber evacuating arrangement applying evacuation to said shielded chamber.

4. A method of processing a sample using a charged beam and reactive gases, comprising the steps of:
   focusing a charged beam emitted from a charged beam source by a charged beam optical system to apply said focused charged beam to a sample;
   shutting a first shutter mechanism disposed between a charged particle detector, and a charged beam chamber including said charged beam source and said charged beam optical system;
   opening a second shutter mechanism for shielding said charged particle detector from reactive gases introduced to a surface of said sample;
   detecting charged particles emitted from said sample when applying said charged beam to said sample by said charged particle detector in order to observe said surface of said sample;
   shutting said second shutter mechanism;
   opening said first shutter mechanism; and
   introducing said reactive gases to said surface of said sample being irradiated with said charged beam to process said surface of said sample; and evacuating a space near said charged particle detector through said charged beam chamber.

5. A method as claimed in claim 4, wherein said second shutter mechanism comprises a seal arrangement which sealingly separates said charged particle detector from a sample chamber when said second shutter mechanism is shut.

6. A method of processing a sample using a charged beam and reactive gases, comprising the steps of:

evacuating a sample chamber for accommodating a sample;

mounting said sample on a stage;

emitting a charged beam from a charged beam source;

applying said charged beam emitted from said charged beam source toward said sample through a charged beam optical system;

introducing reactive gases used to process a surface of said sample in cooperation with said charged beam;

detecting with a charged particle detector charged particles emitted from said surface of said sample to observe a desired part of said surface of said sample;

driving a shielding device so as to open said shielding device during times when said charged particle detector is to detect said charged particles, and driving said shielding device so as to shut said shielding device to shield said charged particle detector from said reactive gases in the shut position thereof whereby said charged particle detector is shielded within a shielded chamber separated from a sample chamber; and evacuating said shielded chamber accommodating said charged particle detector to reduce an interaction of said reactive gases with said charged particle detector.

7. A method as claimed in claim 6, wherein said shielding device comprises a seal arrangement which sealingly separates said shielded chamber from said sample chamber when said shielding device is shut.

8. A method as claimed in claim 6, wherein said evacuating step is conducted using a shielding chamber evacuating arrangement applying evacuation to said shielded chamber.

* * * * *